(12) United States Patent
Yao et al.

(10) Patent No.: US 12,555,547 B2
(45) Date of Patent: Feb. 17, 2026

(54) DISPLAY SUBSTRATE

(71) Applicant: BOE TECHNOLOGY GROUP CO., LTD., Beijing (CN)

(72) Inventors: Xing Yao, Beijing (CN); Chen Xu, Beijing (CN); Jingquan Wang, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 19/023,695

(22) Filed: Jan. 16, 2025

(65) Prior Publication Data
US 2025/0157413 A1  May 15, 2025

Related U.S. Application Data

(63) Continuation of application No. 18/620,521, filed on Mar. 28, 2024, now Pat. No. 12,236,897, which is a continuation of application No. 18/302,056, filed on Apr. 18, 2023, now Pat. No. 11,978,404, which is a continuation of application No. 17/363,639, filed on Jun. 30, 2021, now Pat. No. 11,663,976.

(30) Foreign Application Priority Data

Aug. 28, 2020  (CN) ......................... 202010889271.2

(51) Int. Cl.
G09G 3/3266 (2016.01)
H10K 59/126 (2023.01)
H10K 59/131 (2023.01)

(52) U.S. Cl.
CPC ......... *G09G 3/3266* (2013.01); *H10K 59/126* (2023.02); *H10K 59/131* (2023.02); *G09G 2300/0426* (2013.01); *G09G 2310/0286* (2013.01)

(58) Field of Classification Search
CPC ......... G09G 3/3266; G09G 2310/0286; H10K 59/126; H10K 59/131; G11C 19/28
See application file for complete search history.

(56) References Cited

U.S. PATENT DOCUMENTS

| 2007/0274433 A1 | 11/2007 | Tobita |
| 2008/0030439 A1 | 2/2008 | Shin |
| 2019/0148477 A1 | 5/2019 | Park et al. |

OTHER PUBLICATIONS

Korean Office Action in Korean application: 10-2021-0100563; Mailing Date : Nov. 24, 2025.

*Primary Examiner* — Sardis F Azongha
(74) *Attorney, Agent, or Firm* — Dilworth & Barrese, LLP.; Michael J. Musella, Esq.

(57) ABSTRACT

A display substrate is provided. The display substrate includes a base substrate including a display region and a peripheral region, a gate scan driving circuit, a light-emitting control scan driving circuit, a first power line, a first planarization layer, a second planarization layer and a first shielding layer, a second shielding layer and a plurality of touch traces. The first planarization layer and the second planarization layer further include an open slot. An orthographic projection of at least part of the touch traces on the base substrate falls into the open slot. In an area of the open slot, an orthographic projection of the second shielding layer on the base substrate overlaps with an orthographic projection of a part of the touch traces on the base substrate.

18 Claims, 17 Drawing Sheets

Light-emitting Control Scan Driving Circuit
5

Light-emitting Control Shift Register Unit
105

FIG. 7

Display Device 2

Display Substrate 1

FIG. 8

S110 — Providing a base substrate

S120 — Forming a gate scan driving circuit, a light-emitting control scan driving circuit, a first shielding layer, and a second shielding layer on the base substrate

FIG. 9

DISPLAY SUBSTRATE

CROSS-REFERENCE TO RELATED APPLICATION

This application is a continuation of U.S. patent application Ser. No. 18/620,521 filed on Mar. 28, 2024, which is a continuation of U.S. patent application Ser. No. 18/302,056 filed on Apr. 18, 2023, which is a continuation of U.S. patent application Ser. No. 17/363,639 filed on Jun. 30, 2021, which claims priority of Chinese Patent Application No. 202010889271.2, filed on Aug. 28, 2020. The above-identified applications are incorporated by reference herein in their entirety.

TECHNICAL FIELD

The embodiments of the present disclosure relate to a display substrate.

BACKGROUND

In a field of display technology, for example, a pixel array of a liquid crystal display panel or an organic light-emitting diode (OLED) display panel usually includes a plurality of rows of gate lines and a plurality of columns of data lines interlaced with the gate lines. The gate lines can be driven by a bonded integrated drive circuit. In recent years, with the continuous improvement of the manufacturing process of amorphous silicon thin film transistors or oxide thin film transistors, the gate line drive circuit can also be directly integrate on the thin film transistor array substrate to form GOA (Gate driver On Array) to drive the gate lines. For example, a GOA including a plurality of cascaded shift register units can be used to provide switching state voltage signals (scan signals) for the plurality of rows of gate lines on the pixel array, so as to control the plurality of rows of gate lines to be turned on sequentially, for example, and at the same time, the data lines provide data signals to the pixel units in the corresponding rows of the pixel array, so as to form the gray voltages required by respective gray levels of the displayed image in respective pixel units, and then display a frame of image.

SUMMARY

At least one embodiment of the present disclosure provides a display substrate, comprising: a base substrate, comprising a display region and a peripheral region on at least one side of the display region; and a gate scan driving circuit, a light-emitting control scan driving circuit, and a first power line in the peripheral region of the base substrate and arranged in sequence along a side of the peripheral region away from the display region; the gate scan driving circuit is configured to output a gate scan signal, an output terminal of the light-emitting control scan driving circuit is electrically connected to at least one light-emitting control transistor in the display region, the light-emitting control scan driving circuit is configured to output a light-emitting control signal, the light-emitting control transistor is configured to control a light-emitting element to emit light in response to the light-emitting control signal, and the first power line is electrically connected to a cathode of at least one light-emitting element in the display region; the gate scan driving circuit comprises a first stabilizing capacitor, a first electrode plate of the first stabilizing capacitor is electrically connected to an output terminal of the gate scan driving circuit, and a second electrode plate of the first stabilizing capacitor is electrically connected to the first power line; and the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically connected to the first power line, the second electrode plate of the second stabilizing capacitor comprises a first part and a second part, and an organic insulation layer is provided between the first part and the second part of the second electrode plate of the second stabilizing capacitor in a direction perpendicular to the base substrate.

For example, in the display substrate provided by at least one embodiment of the present disclosure, the light-emitting control scan driving circuit further comprises: a third stabilizing capacitor and a first connection portion; and a first electrode plate of the third stabilizing capacitor is electrically connected to the first connection portion, a second electrode plate of the third stabilizing capacitor is electrically connected to the first power line, the second electrode plate of the third stabilizing capacitor comprises a first part and a second part, and an organic insulation layer is provided between the first part and the second part of the second electrode plate of the third stabilizing capacitor in the direction perpendicular to the base substrate.

For example, in the display substrate provided by at least one embodiment of the present disclosure, the light-emitting control scan driving circuit comprises a plurality of light-emitting control shift register units that are cascaded, and each light-emitting control shift register unit comprises a plurality of transistors, a plurality of capacitors, and a plurality of connection portions, the plurality of transistors comprise: a first transistor, wherein a gate electrode of the first transistor is connected to a first clock signal line to receive a first clock signal, a first electrode of the first transistor is connected to a first node, and a second electrode of the first transistor is connected to an input terminal; a second transistor, wherein a gate electrode of the second transistor is connected to the first node, a first electrode of the second transistor is connected to a second node, and a second electrode of the second transistor is connected to the first clock signal line to receive the first clock signal; a third transistor, wherein a gate electrode of the third transistor is connected to the first clock signal line to receive the first clock signal, a first electrode of the third transistor is connected to the second node, and a second electrode of the third transistor is connected to a second power line to receive a second voltage; a fourth transistor, wherein a gate electrode of the fourth transistor is connected to the second clock signal line to receive the second clock signal, a first electrode of the fourth transistor is connected to the first node, and a second electrode of the fourth transistor is connected to a second electrode of a fifth transistor; the fifth transistor, wherein a gate electrode of the fifth transistor is connected to the second node, and a first electrode of the fifth transistor is connected to a third power line to receive a third voltage; a sixth transistor, wherein a first electrode of the sixth transistor is connected to the second clock signal line to receive the second clock signal, and a second electrode of the sixth transistor is connected to a third node; a seventh transistor, wherein a gate electrode of the seventh transistor is connected to the second clock signal line to receive the second clock signal, a first electrode of the seventh transistor is connected to the third node, and a second electrode of the seventh transistor is connected to a fourth node; an eighth transistor, wherein a gate electrode of the eighth transistor is connected to the first node, a first electrode of the eighth transistor is connected to the fourth node, and a second electrode of the eighth transistor is connected to the third power line to receive the third voltage; a ninth transistor, wherein a gate electrode of the ninth transistor is connected to the fourth node, a first electrode of the ninth transistor is connected to the third power line to receive the third voltage, and a second electrode of the nine transistor is connected to an output terminal; a tenth transistor, wherein a first electrode of the tenth transistor is connected to the second power line to receive the second voltage, and a second electrode of the tenth transistor is connected to the output terminal; an eleventh transistor, wherein a gate electrode of the sixth transistor is connected to a second electrode of the eleventh transistor, a first electrode of a first capacitor is connected to the second electrode of the eleventh transistor, a gate electrode of the eleventh transistor is connected to the second power line to receive the second voltage, and a first electrode of the eleventh transistor is connected to the second node; and a twelfth transistor, wherein a gate electrode of the tenth transistor is connected to a second electrode of the twelfth transistor, a first electrode of a second capacitor is connected to the second electrode of the twelfth transistor, a gate electrode of the twelfth transistor is connected to the second power line to receive the second voltage, and a first electrode of the twelfth transistor is connected to the first node; the plurality of capacitors comprise: the first capacitor, wherein a second electrode of the first capacitor is connected to the third node; the second capacitor, wherein a second electrode of the second capacitor is connected to the second clock signal line to receive the second clock signal; a third capacitor, wherein a first electrode of the third capacitor is connected to the fourth node, and a second electrode of the third capacitor is connected to the third power line to receive the third voltage; the third stabilizing capacitor, wherein the first electrode plate of the third stabilizing capacitor is connected to the first node, and the second electrode plate of the third stabilizing capacitor is electrically connected to the first power line; the second stabilizing capacitor, wherein the first electrode plate of the second stabilizing capacitor is connected to the output terminal of the light-emitting control scan driving circuit, and the second electrode plate of the second stabilizing capacitor is electrically connected to the first power line; a fourth stabilizing capacitor, wherein a first electrode plate of the fourth stabilizing capacitor is connected to the second node, and a second electrode plate of the fourth stabilizing capacitor is electrically connected to the first power line; and the plurality of connection portions comprise: the first connection portion, a second connection portion, and a third connection portion; the first connection portion comprises the first node, the second connection portion comprises the second node, and the third connection portion is connected to the output terminal of the light-emitting control scan driving circuit.

For example, in the display substrate provided by at least one embodiment of the present disclosure, the gate scan driving circuit further comprises a first scan capacitor, and a ratio of a capacitance value of the first stabilizing capacitor to a capacitance value of the first scan capacitor satisfies a following relationship:

$$GH1/EH1 < C24/C21 < GH1/EH2,$$

where C21 represents the capacitance value of the first scan capacitor, C24 represents the capacitance value of the first stabilizing capacitor, GH1 is a duration of an effective level of the gate scan signal output by the gate scan driving circuit in one frame, EH1 is a duration of an effective level of the light-emitting control signal output by the light-emitting control scan driving circuit in one frame, and EH2 is a duration of an ineffective level of the light-emitting control signal output by the light-emitting control scan driving circuit in one frame.

For example, in the display substrate provided by at least one embodiment of the present disclosure, in a case where the light-emitting control scan driving circuit comprises a second capacitor, a ratio of a capacitance value of the second stabilizing capacitor to a capacitance value of the second capacitor of the light-emitting control scan driving circuit satisfies a following relationship:

$$GH1/EH1 < C6/C2 < GH1/EH2,$$

where C6 represents the capacitance value of the second stabilizing capacitor, C2 represents the capacitance value of the second capacitor of the light-emitting control scan driving circuit, GH1 is a duration of an effective level of the gate scan signal output by the gate scan driving circuit in one frame, EH1 is a duration of an effective level of the light-emitting control signal output by the light-emitting control scan driving circuit in one frame, and EH2 is a duration of an ineffective level of the light-emitting control signal output by the light-emitting control scan driving circuit in one frame.

For example, in the display substrate provided by at least one embodiment of the present disclosure, the ratio of the capacitance value of the first stabilizing capacitor to the capacitance value of the first scan capacitor simultaneously satisfies a following relationship:

$$GOL/GOW < C24/C21 < GH1/EH2,$$

where GOL/GOW is a width-to-length ratio of an output transistor of the gate scan driving circuit; or the ratio of the capacitance value of the first stabilizing capacitor to the capacitance value of the first scan capacitor simultaneously satisfies a following relationship:

$$(GSW/GSL)/(GOW/GOL) < C24/C21 < GH1/EH2,$$

where GOW/GOL is a width-to-length ratio of an output transistor of the gate scan driving circuit, and GSW/GSL is a width-to-length ratio of any switch transistor of the gate scan driving circuit.

For example, in the display substrate provided by at least one embodiment of the present disclosure, the ratio of the capacitance value of the second stabilizing capacitor to the capacitance value of the second capacitor of the light-emitting control scan driving circuit satisfies a following relationship:

$$EOL/EOW < C6/C2 < GH1/EH2$$

where EOW/EOL is a width-to-length ratio of an output transistor of the light-emitting control scan driving circuit; or the ratio of the capacitance value of the second stabilizing capacitor to the capacitance value of the second capacitor of the light-emitting control scan driving circuit satisfies a following relationship:

$$(ESW/ESL)/(EOW/EOL) < C6/C2 < GH1/EH2,$$

where EOW/EOL is a width-to-length ratio of an output transistor of the light-emitting control scan driving circuit, and ESW/ESL is a width-to-length ratio of any switch transistor of the light-emitting control scan driving circuit.

For example, in the display substrate provided by at least one embodiment of the present disclosure, the light-emitting control scan driving circuit further comprises: a fourth stabilizing capacitor and a second connection portion; a first electrode plate of the fourth stabilizing capacitor is electrically connected to the second connection portion, and a second electrode plate of the fourth stabilizing capacitor is electrically connected to the first power line, the second electrode plate of the fourth stabilizing capacitor comprises a first part and a second part, and an organic insulation layer is provided between the first part and the second part of the second electrode plate of the fourth stabilizing capacitor in the direction perpendicular to the base substrate.

For example, in the display substrate provided by at least one embodiment of the present disclosure, a duration of an effective level of the light-emitting control signal output by the light-emitting control scan driving circuit in one frame is greater than a duration of an effective level of the gate scan signal output by the gate scan driving circuit in one frame.

For example, in the display substrate provided by at least one embodiment of the present disclosure, the light-emitting control scan driving circuit comprises a plurality of transistors, the first part of the second electrode plate of the second stabilizing capacitor is in a first shielding layer, and the second part of the second electrode plate of the second stabilizing capacitor is in a second shielding layer, the first shielding layer and the second shielding layer are sequentially arranged on a side of the light-emitting control scan driving circuit away from the base substrate; the first shielding layer covers at least one transistor in the light-emitting control scan driving circuit, and the second shielding layer covers at least one transistor of transistors in the light-emitting control scan driving circuit except the at least one transistor covered by the first shielding layer; and the second shielding layer is also on a side of the gate scan driving circuit away from the base substrate, and the second shielding layer covers at least one transistor in the gate scan driving circuit.

For example, in the display substrate provided by at least one embodiment of the present disclosure, the light-emitting control scan driving circuit comprises a plurality of transistors, the first part of the second electrode plate of the third stabilizing capacitor is in a first shielding layer, the second part of the second electrode plate of the third stabilizing capacitor is in a second shielding layer, the light-emitting control scan driving circuit further comprises a fourth stabilizing capacitor, a first part of a second electrode plate of the fourth stabilizing capacitor is in the first shielding layer, and a second part of a second electrode plate of the fourth stabilizing capacitor is in the second shielding layer, the first shielding layer and the second shielding layer are sequentially arranged on a side of the light-emitting control scan driving circuit away from the base substrate; the first shielding layer covers at least one transistor in the light-emitting control scan driving circuit, the second shielding layer covers at least one transistor of transistors in the light-emitting control scan driving circuit except the at least one transistor covered by the first shielding layer; the second shielding layer is also on a side of the gate scan driving circuit away from the base substrate, and the second shielding layer covers at least one transistor in the gate scan driving circuit.

For example, in the display substrate provided by at least one embodiment of the present disclosure, the first shielding layer and the second shielding layer are connected to the first power line to receive a first voltage; the light-emitting control scan driving circuit comprises a plurality of light-emitting control shift register units that are cascaded, and each light-emitting control shift register unit comprises a plurality of transistors, for each light-emitting control shift register unit, the first shielding layer covers at least one transistor in the light-emitting control shift register unit, the second shielding layer covers at least one transistor of a plurality of transistors in the light-emitting control shift register unit except the at least one transistor covered by the first shielding layer.

For example, in the display substrate provided by at least one embodiment of the present disclosure, the light-emitting control scan driving circuit further comprises a second power line or a third power line extending along a first direction, the display substrate further comprises a first power line extending along the first direction; an orthographic projection of the second power line or the third power line on the base substrate is between an orthographic projection of a transistor, which is comprised in the light-emitting control scan driving circuit, on the base substrate and an orthographic projection of the gate scan driving circuit on the base substrate; an orthographic projection of the first power line on the base substrate is on a side of an orthographic projection of the light-emitting control scan driving circuit on the base substrate away from the display region; the second power line, the third power line, and the first power line are on a side of the first shielding layer away from the second shielding layer in the direction perpendicular to the base substrate; an edge of an orthographic projection, close to the display region, of the first shielding layer on the light-emitting control scan driving circuit is on a side of the orthographic projection, away from the display region, of the second power line or the third power line on the base substrate; an orthographic projection of an edge of the first shielding layer away from the display region on the base substrate overlaps the orthographic projection of the first power line on the base substrate; the light-emitting control scan driving circuit comprises a plurality of output transistors configured to output light-emitting control signals to light-emitting control transistors of the display region row by row; and an orthographic projection of an edge of the first shielding layer close to the display region on the base substrate is between orthographic projections of the plurality of output transistors on the base substrate and the orthographic projection of the second power line or the third power line on the base substrate.

For example, in the display substrate provided by at least one embodiment of the present disclosure, an orthographic projection of an edge of the second shielding layer close to the display region on the base substrate overlaps the orthographic projection of the gate scan driving circuit on the base substrate; an orthographic projection of an edge of the second shielding layer away from the display region on the base substrate overlaps the orthographic projection of the first power line on the base substrate; the orthographic projection of the edge of the second shielding layer close to the display region on the base substrate overlaps an orthographic projection of an output transistor, that outputs the gate scan signal, of the gate scan driving circuit on the base substrate; or the orthographic projection of the edge of the second shielding layer close to the display region on the base substrate overlaps an orthographic projection of an edge of the gate scan driving circuit close to the display region on the base substrate.

For example, in the display substrate provided by at least one embodiment of the present disclosure, corresponding to each light-emitting control shift register unit, the first shielding layer comprises a plurality of first openings arranged periodically, the second shielding layer comprises a plurality of second openings arranged periodically, the first shielding layer and the second shielding layer respectively cover at least part of transistors of the light-emitting control shift register unit; a density of the plurality of first openings ranges from 10% to 50%, and a density of the plurality of second openings ranges from 10% to 50%; a shape of each first opening and a shape of each second opening are square, and a size of each first opening and a size of each second opening range from 10 μm*10 μm to 20 μm*20 μm; an orthographic projection of an edge of each first opening and an orthographic projection of an edge of each second opening on the base substrate do not overlap; and the orthographic projection of the edge of the first opening on the base substrate and the orthographic projection of the edge of the second opening on the base substrate are alternately arranged.

For example, in the display substrate provided by at least one embodiment of the present disclosure, corresponding to each light-emitting control shift register unit, the first shielding layer comprises a plurality of first openings arranged non-periodically, the second shielding layer comprises a plurality of second openings arranged non-periodically, the first shielding layer and the second shielding layer respectively cover at least part of transistors of the light-emitting control shift register unit; a density of the plurality of first openings ranges from 10% to 25%, and a density of the plurality of second openings ranges from 10% to 25%; a size of each first opening and a size of each second opening are positively correlated with areas of transistors respectively corresponding each first opening and each second opening; an orthographic projection of an edge of each first opening and an orthographic projection of an edge of each second opening on the base substrate do not overlap; and the orthographic projection of the edge of the first opening on the base substrate and the orthographic projection of the edge of the second opening on the base substrate are alternately arranged.

For example, the display substrate provided by at least one embodiment of the present disclosure, further comprises: a first planarization layer and a second planarization layer; the first planarization layer is on a side of the first shielding layer away from the second shielding layer in the direction perpendicular to the base substrate, the second planarization layer is between the first shielding layer and the second shielding layer in the direction perpendicular to the base substrate; the second planarization layer is the organic insulation layer; the second shielding layer is connected to the first shielding layer through a plurality of holes penetrating the second planarization layer; the light-emitting control scan driving circuit comprises a plurality of light-emitting control shift register units that are cascaded, and each light-emitting control shift register unit comprises a plurality of transistors; for each light-emitting control shift register unit, the first shielding layer covers at least one transistor in the light-emitting control shift register unit, and the second shielding layer covers at least one transistor of transistors in the light-emitting control shift register unit except the at least one transistor covered by the first shielding layer; corresponding to each light-emitting control shift register unit, the first shielding layer comprises a plurality of first openings arranged periodically, the second shielding layer comprises a plurality of second openings arranged periodically, the first shielding layer and the second shielding layer respectively cover at least part of transistors of the light-emitting control shift register unit; in a second direction perpendicular to the first direction, the plurality of holes are between the first openings and the second openings; and a shape of each hole is round or square, and an aperture of each hole ranges from 3 μm to 5 μm.

For example, the display substrate provided by at least one embodiment of the present disclosure, further comprises: a support layer, wherein the support layer is on a side of the second shielding layer away from the first shielding layer, and an orthographic projection of the support layer on the base substrate overlaps an orthographic projection of an edge of a column of holes of the plurality of holes away from the display region on the base substrate.

For example, in the display substrate provided by at least one embodiment of the present disclosure, further comprises: a semiconductor layer, a first insulation layer, a first conductive layer, a second insulation layer, a second conductive layer, a third insulation layer, a third conductive layer, and a fourth insulation layer, which are arranged in sequence between the base substrate and the first shielding layer in the direction perpendicular to the base substrate; the semiconductor layer comprises active layers of the plurality of transistors, the first conductive layer comprises gate electrodes of the plurality of transistors and first electrodes of a plurality of capacitors, the second conductive layer comprises second electrodes of the plurality of capacitors, and the third conductive layer comprises a plurality of connection portions, a first clock signal line, a second clock signal line, a second power line, and a third power line; a plurality of stabilizing capacitors are formed between the first shielding layer as well as the second shielding layer and the third conductive layer, respectively; the first shielding layer and the second shielding layer respectively serve as second electrode plates of the plurality of stabilizing capacitors, and first electrode plates of the plurality of stable capacitors are on the third conductive layer; a part of the first shielding layer away from the display region comprises a first part and a second part that is on a side of the first planarization layer away from the base substrate, a part of the second shielding layer away from the display region comprises a first part and a second part that is on a side of the second planarization layer away from the base substrate; the first power line comprises a part of the third conductive layer away from the display region, the first part of the first shielding layer, and the first part of the second shielding layer, and the part of the third conductive layer away from the display region, the first part of the first shielding layer, and the first part of the second shielding layer are in direct contact; and an included angle between the second part of the first shielding layer and the third conductive layer ranges from 20° to 30°, and an included angle between the second part of the second shielding layer and the third conductive layer ranges from 25° to 40°.

For example, in the display substrate provided by at least one embodiment of the present disclosure, the first planarization layer and the second planarization layer further comprise an open slot between the light-emitting control scan driving circuit and the gate scan driving circuit; the first planarization layer comprises a first part, which is on a side of the open slot away from the display region and covering the light-emitting control scan driving circuit, and a second part, which is on the side of the open slot away from the display region and covering the gate scan driving circuit; the second planarization layer comprises a first part, which is on the side of the open slot away from the display region and covering the light-emitting control scan driving circuit, and a second part, which is on the side of the open slot away from the display region and covering the gate scan driving circuit; the orthographic projection of the edge of the first shielding layer close to the display region on the base substrate falls within an orthographic projection of the first part of the second planarization layer on the base substrate; the orthographic projection of the first part of the second planarization layer on the base substrate falls within an orthographic projection of the first part of the first planarization layer on the base substrate; the second shielding layer extends from a region corresponding to the light-emitting control scan driving circuit to a region corresponding to the gate scan driving circuit, and covers the open slot; a width B of an orthographic projection of the second shielding layer, which covers the open slot, on the base substrate in the second direction perpendicular to the first direction is expressed as a following formula:

$$B = A + k1*P1 + k2*Q1 + k3*P2 + k4*Q2,$$

$$P1 = d1*\tan(c1), P2 = d2*\tan(c2),$$

where A represents a width of an orthographic projection of the open slot on the base substrate in the second direction, P1 represents a width of an orthographic projection of a first slope of the second shielding layer on the base substrate, Q1 represents a width of an orthographic projection of a first platform of the second shielding layer on the base substrate, P2 represents a width of an orthographic projection of a second slope of the second shielding layer on the base substrate, Q2 represents a width of an orthographic projection of a second platform of the second shielding layer on the base substrate, d1 represents a thickness of the first planarization layer, d2 represents a thickness of the second planarization layer, c1 represents a slope angle of the first planarization layer, c2 represents a slope angle of the second planarization layer, k1, k2, k3, and k4 are coefficients, where 1<k1≤2, 1<k2≤2, 1<k3≤2, 1<k4≤2;
in a position where the first shielding layer is close to the open slot, an included angle between the first shielding layer and the second shielding layer ranges from 25° to 40°.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

FIG. 7 is a schematic diagram of a light-emitting control scan driving circuit provided by at least one embodiment of the present disclosure;

FIG. 8 is a schematic diagram of a display device provided by at least one embodiment of the present disclosure; and FIG. 9 is a flowchart of a manufacturing method of a display substrate provided by at least one embodiment of the present disclosure.

DETAILED DESCRIPTION

Figure 1A:
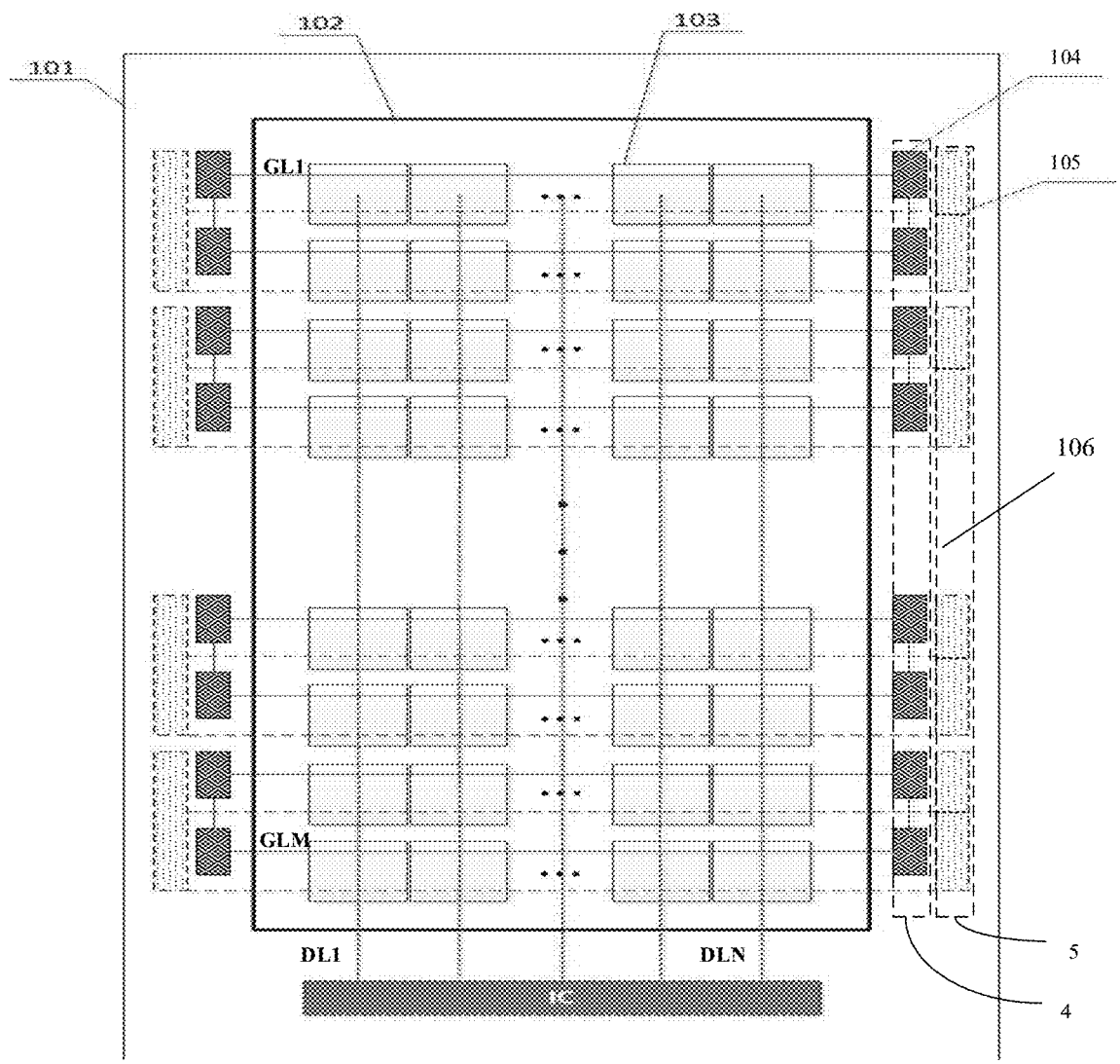
FIG. 1A is a schematic diagram of an overall circuit structure of a display panel.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Hereinafter, the present disclosure will be described through several specific embodiments. In order to keep the following description of the embodiments of the present invention clear and concise, detailed descriptions of known functions and known components may be omitted. When any component of the embodiment of the present invention appears in more than one drawing, the component is represented by the same reference numeral in each drawing.

FIG. 1A is a schematic diagram of an overall circuit structure of a display panel. For example, as shown in FIG. 1A, 101 represents the overall outer frame line of the display panel; the display panel includes a display region (i.e., a pixel array region) 102 and a peripheral region 106 located around the display region 102, the display region includes pixel units 103 arranged in an array; the peripheral region 106 includes a scan driving shift register unit 104, a plurality of cascaded scan driving shift register units 104 constitute a gate scan driving circuit (Gate GOA), which is used to provide, for example, gate scan signals shifted row by row to the pixel units 103 arranged in an array in the display region 102 of the display panel 101; the peripheral region 106 also includes a light-emitting control shift register unit 105, a plurality of cascaded light-emitting control shift register units 105 constitute a light-emitting control scan driving circuit (EM GOA), which is used to provide, for example, light-emitting control signals shifted row by row to the pixel units 103 arranged in an array in the display region 102 of the display panel 101, that is, is a gate scan driving circuit used to output light-emitting control signals.

As shown in FIG. 1A, data lines DL1-DLN (N is an integer greater than 1) connected to a data driving chip IC longitudinally pass through the display region 102, to provide data signals for the pixel units 103 arranged in an array; gate lines GL1-GLM (M is an integer greater than 1) connected to the scan driving shift register unit 104 and the light-emitting control shift register unit 105 traverse the display region 102 to provide gate scan signals and light-emitting control signal for the pixel units 103 arranged in the array. For example, each pixel unit 103 may include a pixel circuit with a circuit structure, such as 7T1C, 7T2C, 8T2C, or 4T1C in the art and a light-emitting element, the pixel circuit operates under the control of the data signal transmitted through the data line and the gate scan signal and the light-emitting control signal transmitted through the scan line to drive the light-emitting element to emit light to achieve operations such as display. The light-emitting element may be, for example, an organic light-emitting diode (OLED) or a quantum dot light-emitting diode (QLED).

Figure 1B:
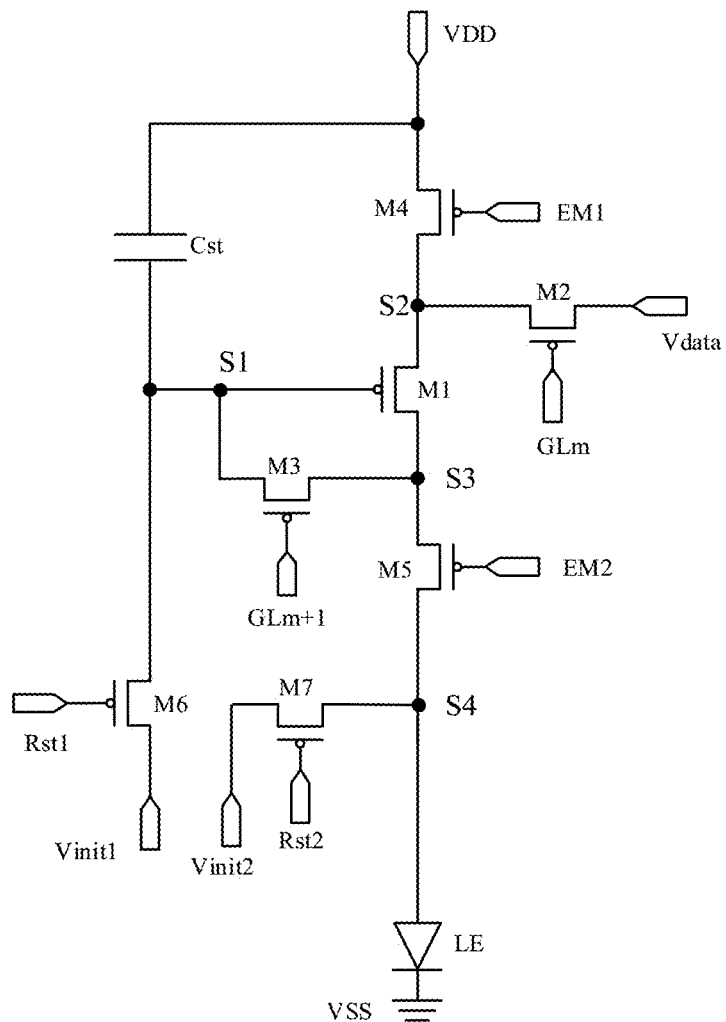
FIG. 1B is a circuit structure diagram of a 7T1C pixel circuit.

FIG. 1B is a circuit structure diagram of a 7T1C pixel circuit. As shown in FIG. 1B, the pixel circuit includes a drive transistor M1, a data writing transistor M2, a compensation transistor M3, a storage capacitor Cst, light-emitting control transistors M4/M5, and reset transistors M6/M7, and also includes a drive node S1, a data writing node S2, a compensation node S3, and a light-emitting control node S4. For example, a gate electrode of the data writing transistor M2 is connected to a gate line GLm (m is an integer greater than 0 and less than or equal to M) to receive the gate scan signal provided by the gate scan driving circuit; gate electrodes of the light-emitting control transistors M4/M5 are respectively connected to light-emitting control signal lines EM1 and EM2 (for example, the light-emitting control signal lines are gate lines), to receive the light-emitting control signal provided by the light-emitting control scan driving circuit to drive the light-emitting element LE to emit light. For the specific connection relationship and working principle of the pixel circuit, reference may be made to the design in this field, and repeated portions will not be repeated here.

Figure 1C:
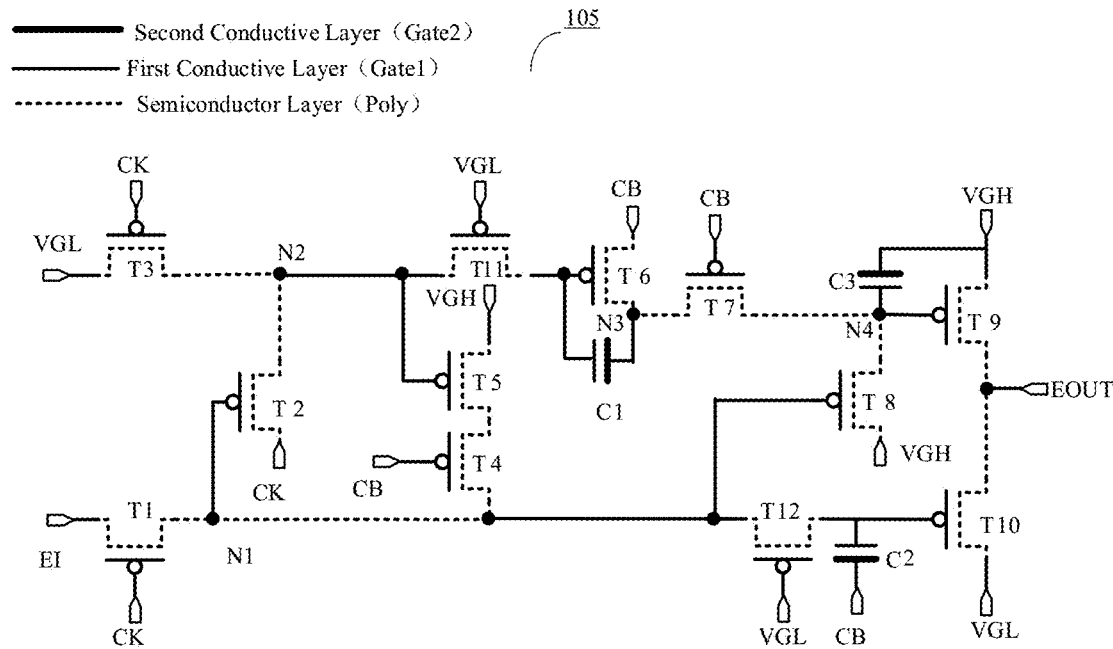
FIG. 1C is a circuit diagram of a light-emitting control shift register unit.
Figure 1D:
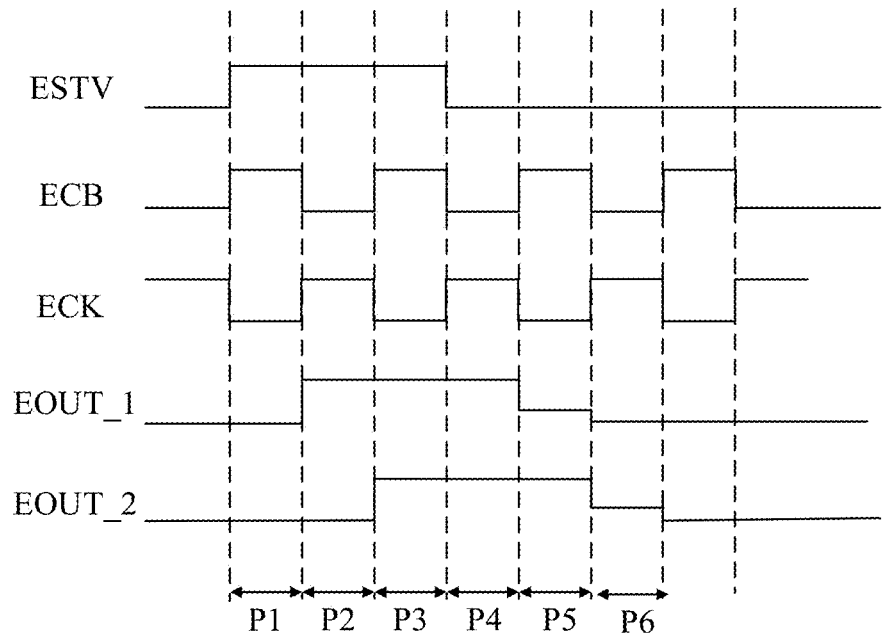
FIG. 1D is a signal timing diagram of the light-emitting control shift register unit shown in FIG. 1C during operation.

FIG. 1C is a circuit structure diagram of a light-emitting control shift register unit. FIG. 1D is a signal timing diagram of the light-emitting control shift register unit shown in FIG. 1C during operation. The working process of the light-emitting control shift register unit will be briefly introduced below in conjunction with FIG. 1C and FIG. 1D.

As shown in FIG. 1C, the light-emitting control shift register unit 105 includes 12 transistors (a first transistor T1, a second transistor T2, a third transistor T3, a fourth transistor T4, a fifth transistor T5, a sixth transistor T6, a seventh transistor T7, an eighth transistor T8, an output transistor T9 (also called a ninth transistor), a tenth transistor T10 (also called an output transistor), an eleventh transistor T11, and a twelfth transistor T12), and three capacitors (a first capacitor C1, a second capacitor C2, and a third capacitor C3). For example, in the case where a plurality of light-emitting control shift register units 105 are cascaded, a second electrode of a first transistor T1 in a first stage of light-emitting control shift register unit 105 is connected to an input terminal EI, the input terminal EI is configured to be connected to a trigger signal line ESTV to receive a trigger signal as an input signal, a second electrode of the first transistor T1 in the light-emitting control shift register unit 105 in other stage is electrically connected to the output terminal of a previous stage of light-emitting control shift register unit 105, to receive the output signal output by the output terminal EOUT of the previous stage of light-emitting control shift register unit 105 as the input signal, thereby achieving the shift output, so as to provide, for example, light-emitting control signals shifted row by row to the pixel units 103 arranged in an array in the display region 102 of the display panel 101.

In addition, as shown in FIG. 1C and FIG. 1D, the light-emitting control shift register unit further includes a first clock signal terminal CK and a second clock signal terminal CB, ECK represents a first clock signal line, ECB represents a second clock signal line, for example, the first clock signal terminal CK is connected to the first clock signal line ECK or the second clock signal line ECB to receive a first clock signal. For example, in the case where the first clock signal terminal CK is connected to the first clock signal line ECK, the first clock signal line ECK provides the first clock signal, and in the case where the first clock signal terminal CK is connected to the second clock signal line ECB, the second clock signal line ECB provides the first clock signal; the specific situation depends on the actual situation, the embodiments of the present disclosure are not limited to this case. Similarly, the second clock signal terminal CB is connected to the second clock signal line ECB or the first clock signal line ECK to receive a second clock signal. In the following, the case that the first clock signal terminal CK is connected to the first clock signal line ECK to receive the first clock signal and the second clock signal terminal CB is connected to the second clock signal line ECB to receive the second clock signal is taken as an example to describe, the embodiments of the present disclosure are not limited to this case. For example, the first clock signal and the second clock signal may use pulse signals with a duty cycle greater than 50%, the difference between the first clock signal and the second clock signal is, for example, half a cycle; VGL represents a second power line and a second voltage provided by the second power line, VGH represents a third power line and a third voltage provided by the third power line, and the third voltage is greater than the second voltage; for example, the third voltage is a DC high level, and the second voltage is a DC low level; N1, N2, N3, and N4 respectively represent the first node, the second node, the third node, and the fourth node in the circuit diagram.

As shown in FIGS. 1C and 1D, a gate electrode of the first transistor T1 is connected to the first clock signal terminal CK (the first clock signal terminal CK is connected to the first clock signal line ECK) to receive the first clock signal, a second electrode of the first transistor T1 is connected to the input terminal EI, and a first electrode of the first transistor T1 is connected to the first node N1. For example, in the case where the light-emitting control shift register unit is a first stage of light-emitting control shift register unit, the input terminal EI is connected to the trigger signal line ESTV to receive the trigger signal. In the case where the light-emitting control shift register unit is a light-emitting control shift register unit in other stage except the first stage of light-emitting control shift register unit, the input terminal EI is connected to the output terminal EOUT of a previous stage of light-emitting control shift register unit.

A gate electrode of the second transistor T2 is connected to the first node N1, a first electrode of the second transistor T2 is connected to the second node N2, and a second electrode of the second transistor T2 is connected to the first clock signal terminal CK to receive the first clock signal.

A gate electrode of the third transistor T3 is connected to the first clock signal terminal CK to receive the first clock signal, a first electrode of the third transistor T3 is connected to the second node N2, and a second electrode of the third transistor T3 is connected to the second power line VGL to receive the second voltage.

A gate electrode of the fourth transistor T4 is connected to the second clock signal terminal CB (for example, the second clock signal terminal CB is connected to the second clock signal line ECB) to receive the second clock signal, a first electrode of the fourth transistor T4 is connected to the first node N1, and a second electrode of the fourth transistor T4 is connected to a second electrode of the fifth transistor T5.

A gate electrode of the fifth transistor T5 is connected to the second node N2, and a first electrode of the fifth transistor T5 is connected to the third power line VGH to receive the third voltage.

A gate electrode of the sixth transistor T6 is connected to a second electrode of the eleventh transistor T11, a first electrode of the sixth transistor T6 is connected to the second clock signal terminal CB to receive the second clock signal, and a second electrode of the sixth transistor T6 is connected to the third node N3.

A first electrode of the first capacitor C1 is connected to a second electrode of the eleventh transistor T11, and a second electrode of the first capacitor C2 is connected to the third node N3.

A gate electrode of the seventh transistor T7 is connected to the second clock signal terminal CB to receive the second clock signal, a first electrode of the seventh transistor T7 is connected to the third node N3, and a second electrode of the seventh transistor T7 is connected to the fourth node N4.

A gate electrode of the eighth transistor T8 is connected to the first node N1, a first electrode of the eighth transistor T8 is connected to the fourth node N4, and a second electrode of the eighth transistor T8 is connected to the third power line VGH to receive the third voltage.

A gate electrode of the output transistor T9 is connected to the fourth node N4, a first electrode of the output transistor T9 is connected to the third power line VGH to receive the third voltage, and a second electrode of the output transistor T9 is connected to the output terminal EOUT.

A first electrode of the third capacitor C3 is connected to the fourth node N4, and a second electrode of the third capacitor C3 is connected to the third power line VGH to receive the third voltage.

A gate electrode of the tenth transistor T10 is connected to the second electrode of the twelfth transistor T12, a first electrode of the tenth transistor T10 is connected to the second power line VGL to receive the second voltage, and a second electrode of the tenth transistor T10 is connected to the output terminal EOUT.

A first electrode of the second capacitor C2 is connected to a second electrode of the twelfth transistor T12, and a second electrode of the second capacitor C2 is connected to the second clock signal terminal CB to receive the second clock signal.

A gate electrode of the eleventh transistor T11 is connected to the second power line VGL to receive the second voltage, and a first electrode of the eleventh transistor T11 is connected to the second node N2.

A gate electrode of the twelfth transistor T12 is connected to the second power line VGL to receive the second voltage, and a first electrode of the twelfth transistor T12 is connected to the first node N1.

The transistors in the light-emitting control shift register unit 105 shown in FIG. 1C are all described by using P-type transistors as an example, that is, each transistor is turned on in the case where the gate electrode of the transistor receives a low level (a turn-on level), and is turned off in the case where the gate electrode of the transistor receives a high level (a turn-off level). In this case, the first electrode of the transistor may be a source electrode, and the second electrode of the transistor may be a drain electrode.

The light-emitting control shift register unit includes but is not limited to the configuration shown FIG. 1C. For example, the light-emitting control shift register unit 105 may not include transistors T11 and T12, and a transistor with a similar function to transistors T11 or T12 may also be arranged at the node N3 or node N4. Respective transistors can also use N-type transistors or use P-type transistors and N-type transistors in a mixed manner, it is only necessary to simultaneously connect the port polarity of the selected type of transistor according to the port polarity of the corresponding transistor in the embodiments of the present disclosure.

It should be noted that the transistors used in the light-emitting control shift register unit can all be thin film transistors or field effect transistors or other switching devices with the same characteristics. Here, the thin film transistors are used as an example for description, for example, an active layer (channel region) of the transistor is made of semiconductor materials, such as polysilicon (such as low-temperature polysilicon or high-temperature polysilicon), amorphous silicon, indium gallium tin oxide (IGZO), etc., while the gate electrode, a source electrode, a drain electrode, and the like are made of metal materials, such as metal aluminum or aluminum alloy. The source electrode and the drain electrode of the transistor used here can be symmetrical in structure, so the source electrode and the drain electrode of the transistor can be indistinguishable in structure. In the embodiments of the present disclosure, in order to distinguish the two electrodes of the transistor other than the gate electrode, one electrode of the two electrodes is directly described as the first electrode and the other electrode of the two electrodes is the second electrode. In addition, in the embodiments of the present disclosure, the electrode of the capacitor may be a metal electrode or one of the electrodes of the capacitor may be made of a semiconductor material (such as doped polysilicon).

FIG. 1D is a signal timing diagram of the light-emitting control shift register unit 105 shown in FIG. 1C during operation. The working process of the light-emitting control shift register unit will be described in detail below in conjunction with FIG. 1C and FIG. 1D. For example, the working principle of the first stage of light-emitting control shift register unit 105 is described, and the working principles of the light-emitting control shift register unit 105 at other stages are similar to the first stage of light-emitting control shift register unit 105, and will not be repeated. As shown in FIG. 1D, the working process of the light-emitting control shift register unit 105 includes six phases, namely a first phase P1, a second phase P2, a third phase P3, a fourth phase P4, a fifth phase P5, and a sixth phase P6, FIG. 1D shows the timing waveforms of the various signals in each phase.

In the first phase P1, as shown in FIG. 1D, the first clock signal line ECK provides a low level. Therefore, the first clock signal terminal CK connected to the first clock signal line ECK receives a low-level first clock signal, the first transistor T1 and the third transistor T3 are turned on, and the turned-on first transistor T1 transmits the high-level trigger signal ESTV to the first node N1, so that the level of the first node N1 becomes a high level, so that the second transistor T2, the eighth transistor T8, and the tenth transistor T10 are turned off. In addition, the turned-on third transistor T3 transmits the low-level second voltage to the second node N2, so that the level of the second node N2 becomes a low level, so that the fifth transistor T5 and the sixth transistor T6 are turned on. Because the second clock signal line ECB provides a high level, the second clock signal received by the second clock signal terminal CB connected to the second clock signal line ECB is at a high level, and therefore, the fourth transistor T4 and the seventh transistor T7 are turned off. In addition, due to the storage function of the third capacitor C3, the level of the fourth node N4 can be maintained at a high level, so that the output transistor T9 is turned off. In the first phase P1, because the output transistor T9 and the tenth transistor T10 are both turned off, the output signal output by the output terminal EOUT_1 of the light-emitting control shift register unit 105 maintains the previous low level.

In the second phase P2, as shown in FIG. 1D, the second clock signal line ECB provides a low-level second clock signal to the second clock signal terminal CB, so that the fourth transistor T4 and the seventh transistor T7 are turned on. Because the first clock signal line ECK provides a high-level first clock signal to the first clock signal terminal, the first transistor T1 and the third transistor T3 are turned off. Due to the storage function of the first capacitor C1, the second node N2 can continue to maintain the low level of the previous phase, so that the fifth transistor T5 and the sixth transistor T6 are turned on. The high-level third voltage VGH is transmitted to the first node N1 through the turned-on fifth transistor T5 and the turned-on fourth transistor T4, so that the level of the first node N1 continues to maintain the high level of the previous phase, and therefore, the second transistor T2, the eighth transistor T8, and the tenth transistor T10 are turned off. In addition, the low-level second clock signal is transmitted to the fourth node N4 through the turned-on sixth transistor T6 and the turned-on seventh transistor T7, so that the level of the fourth node N4 becomes a low level, and therefore, the output transistor T9 is turned on, the turned-on output transistor T9 outputs the high-level third voltage VGH, so that the output signal output by the output terminal EOUT_1 of the light-emitting control shift register unit 105 in the second phase P2 is at a high level.

In the third phase P3, as shown in FIG. 1D, the first clock signal line ECK provides a low-level first clock signal to the first clock signal terminal CK, so that the first transistor T1 and the third transistor T3 are turned on. The second clock signal line ECB provides a high-level second clock signal to the second clock signal terminal CB, so that the fourth transistor T4 and the seventh transistor T7 are turned off. Due to the storage function of the third capacitor C3, the level of the fourth node N4 can maintain the low level of the previous phase, so that the output transistor T9 is kept turned on, and the turned-on output transistor T9 outputs the high-level third voltage VGH, and therefore, the output signal output by the output terminal EOUT_1 of the light-emitting control shift register unit 105 in the third phase P3 is still at a high level. At the same time, in this phase, the output terminal EOUT_2 of the second stage of light-emitting control shift register unit 105 outputs a high level (for specific description, reference may be made to the working process of the first stage of light-emitting control shift register unit 105 in the second phase P2).

In the fourth phase P4, as shown in FIG. 1D, the first clock signal line ECK provides a high-level first clock signal to the first clock signal terminal CK, so that the first transistor T1 and the third transistor T3 are turned off. The second clock signal line ECB provides a low-level second clock signal to the second clock signal terminal CB, so that the fourth transistor T4 and the seventh transistor T7 are turned on. Due to the storage function of the second capacitor C2, the level of the first node N1 maintains the high level of the previous phase, so that the second transistor T2, the eighth transistor T8, and the tenth transistor T10 are turned off. Due to the storage function of the first capacitor C1, the second node N2 continues to maintain the low level of the previous phase, so that the fifth transistor T5 and the sixth transistor T6 are turned on. In addition, the low-level second clock signal is transmitted to the fourth node N4 through the turned-on sixth transistor T6 and the turned-on seventh transistor T7, so that the level of the fourth node N4 becomes a low level, and therefore, the output transistor T9 is turned on, the turned-on output transistor T9 outputs the high-level third voltage VGH, the output signal output by the output terminal EOUT_1 of the light-emitting control shift register unit 105 in the fourth phase P4 is still at a high level. At the same time, in this phase, the output terminal EOUT_2 of the second stage of light-emitting control shift register unit 105 outputs a high level (for specific description, reference may be made to the working process of the first stage of light-emitting control shift register unit 105 in the third phase P3).

In the fifth phase P5, as shown in FIG. 1D, the first clock signal line ECK provides a low-level first clock signal to the first clock signal terminal CK, so that the first transistor T1 and the third transistor T3 are turned on. The second clock signal line ECB provides a high-level second clock signal to the second clock signal terminal CB, so that the fourth transistor T4 and the seventh transistor T7 are turned off. The turned-on first transistor T1 transmits the low-level trigger signal ESTV to the first node N1, so that the level of the first node N1 becomes a low level.

For example, in the fifth phase P5, the low-level voltage of the first clock signal is −6V, the low-level voltage of the trigger signal ESTV is −6V, and a threshold voltage Vth of the first transistor T1 is −1.5V. Because the first transistor T1 is a P-type transistor, in order to turn on the first transistor T1, the voltage Vgs between the gate electrode and the source electrode of the first transistor T1 needs to be smaller than the threshold voltage Vth of the first transistor T1. Therefore, in the case where the first node N1 is charged to −4.5V, the first transistor T1 is turned off, at this time, the first node N1 is stopped to be charged, that is, in this phase, the low-level voltage of the first node N1 is −4.5V, so that the second transistor T2, the eighth transistor T8, and the tenth transistor T10 are turned on. The turned-on second transistor T2 transmits the low-level first clock signal to the second node N2, thereby further pulling down the level of the second node N2, so that the second node N2 continues to maintain the low level of the previous phase, as a result, the fifth transistor T5 and the sixth transistor T6 are turned on. In addition, the turned-on eighth transistor T8 transmits the high-level third voltage VGH to the fourth node N4, so that the level of the fourth node N4 becomes a high level, so that the output transistor T9 is turned off. The turned-on tenth transistor T10 responds to the low level (for example, −4.5V) of the first node N1 to output the low-level second voltage VGL (for example, −6V). Similarly, the threshold voltage Vth of the tenth transistor T10 is -1.5V, in order to turn on the tenth transistor T10, the voltage Vgs between the gate electrode and the source electrode of the tenth transistor T10 needs to be smaller than the threshold voltage Vth of the tenth transistor T10. Therefore, in the case where the voltage output by the output terminal EOUT_1 is −3V, the tenth transistor T10 is turned off, that is, the low-level voltage output by the output terminal EOUT_1 in this phase is −3V, so that the output signal output by the output terminal EOUT_1 of the first stage of light-emitting control shift register unit 105 in the fifth phase P5 becomes a first low level (for example, −3V). At the same time, in this phase, the output terminal EOUT_2 of the second stage of light-emitting control shift register unit 105 outputs a high level (for specific description, reference may be made to the working process of the first stage of light-emitting control shift register unit 105 in the fourth phase P4).

In the sixth phase P6, as shown in FIG. 1D, the first clock signal line ECK provides a high-level first clock signal to the first clock signal terminal CK, and the second clock signal line ECB provides a low-level second clock signal to the second clock signal terminal CB, so that the fourth transistor T4 and the seventh transistor T7 are turned on. Because the second clock signal changes from the high level in the fifth phase P5 to the low level, for example, the amount of change is Δt (for example, greater than 6V), according to the bootstrap effect of the second capacitor C2, the level of the first node N1 changes from the low level (for example, −4.5V) in the fifth phase P5 to a lower low level (for example, −4.5V−Δt), thus, the second transistor T2 and the tenth transistor T10 are turned on under the control of the low level (for example, −4.5V−Δt) of the first node N1, according to the turn-on characteristics of the tenth transistor T10 described above, the low-level second voltage VGL (for example, −6V) can be completely output to the output terminal EOUT_1. For example, in the sixth phase P6, the voltage output by the output terminal EOUT_1 is the second low level (for example, −6V). At the same time, in this phase, the output terminal EOUT_2 of the second stage of light-emitting control shift register unit 105 outputs a low level (for example, −3V, for specific description, reference may be made to the working process of the first stage of light-emitting control shift register unit 105 in the fifth phase P5).

It should be noted that in each of the above phases, because the second power line VGL always provides a low level, the eleventh transistor T11 and the twelfth transistor T12 are always turned on, thereby avoiding the second clock signal provided by the second clock signal terminal CB connected to the sixth transistor T6 and the output signal of the output terminal EOUT connected to the tenth transistor from affecting the levels of the second node N2 and the first node N1, respectively, thereby ensuring the stability of the circuit.

Figure 1E:
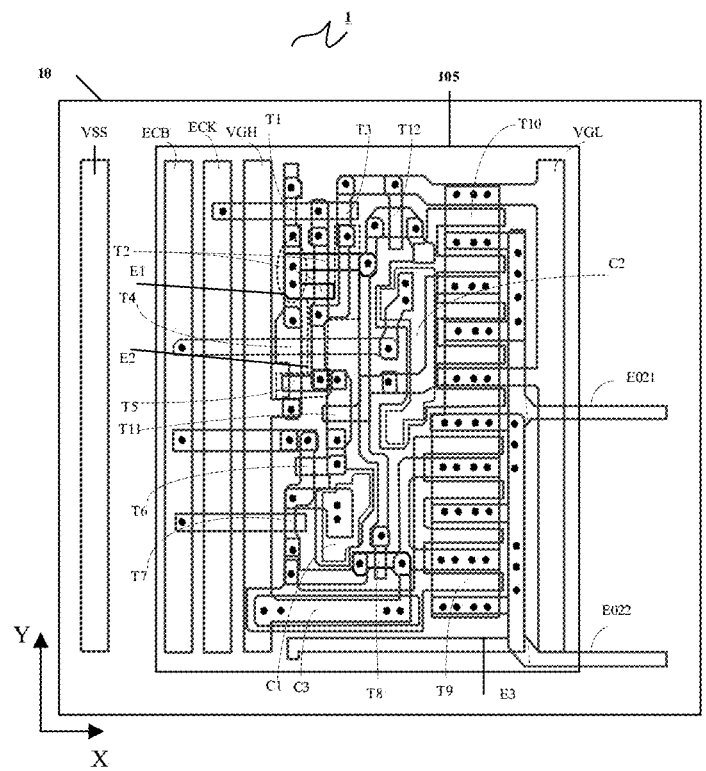
FIG. 1E is a schematic diagram of a layout of the light-emitting control shift register unit shown in FIG. 1C on a display substrate.
Figure 1F:
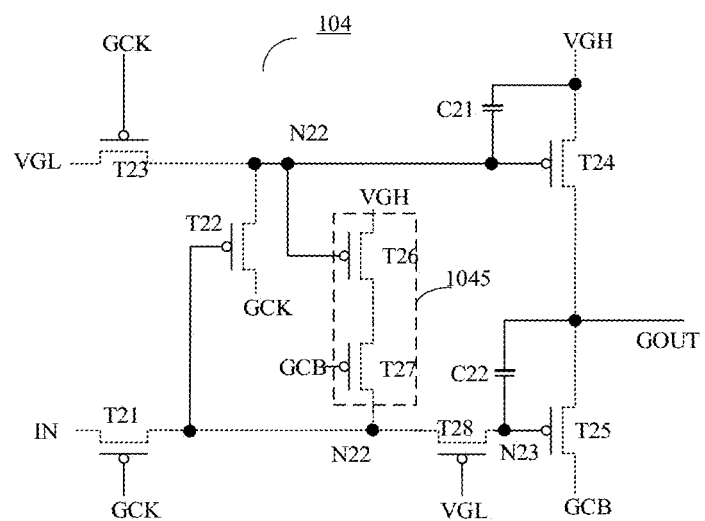
FIG. 1F is a schematic diagram of a gate scan shift register unit provided by at least one embodiment of the present disclosure.

FIG. 1F is a schematic diagram of a gate scan shift register unit provided by at least one embodiment of the present disclosure. For example, as shown in FIG. 1F, the gate scanning shift register unit 104 includes 8 transistors (an input transistor T21, a first control transistor T22, a second control transistor T23, an output control transistor T24, a gate output transistor T25, a first noise reduction transistor T26, a second noise reduction transistor T27, and a voltage stabilizing transistor T28) and two capacitors (a first scan capacitor C21 and a second scan capacitor C22). For example, when a plurality of gate scan shift register units 104 are cascaded, a first electrode of the input transistor T1 in the first stage of gate scan shift register unit 104 is connected to the input terminal IN, the input terminal IN is configured to be connected to the trigger signal line GSTV to receive the trigger signal as an input signal, a first electrode of the input transistor T1 in the gate scan shift register unit 104 in other stage is electrically connected to the output terminal of a previous stage of gate scan shift register unit 104, to receive the output signal output from the output terminal GOUT of the previous stage of gate scan shift register unit 104 as an input signal, thereby achieving shift output for performing, for example, progressive scanning on the array of pixel units in the active display region.

As shown in FIG. 1F, a gate electrode of the input transistor T21 is connected to a first sub-clock signal line GCK, a second electrode of the input transistor T1 is connected to the input terminal IN, and a first electrode of the input transistor T1 is connected to a first scan node N21.

A gate electrode of the first control transistor T22 is connected to the first scan node N21, a second electrode of the first control transistor T22 is connected to the first sub-clock signal line GCK, and a first electrode of the first control transistor T22 is connected to a second scan node N22.

A gate electrode of the second control transistor T23 is connected to the first sub-clock signal line GCK, a second electrode of the second control transistor is connected to the second power line VGL, and a first electrode of the second control transistor T23 is connected to the second scan node N22.

A gate electrode of the output control transistor T24 is connected to the second scan node N22, a first electrode of the output control transistor T24 is connected to the third power line VGH, and a second electrode of the output control transistor T24 is connected to the output terminal GOUT.

A first electrode of the first scan capacitor C21 is connected to the second scan node N22, and a second electrode of the first scan capacitor C21 is connected to the third power line VGH.

A gate electrode of the gate output transistor T25 is connected to the third scan node N23, a first electrode of the output transistor T5 is connected to the second clock sub-signal line GCB, and a second electrode of the gate output transistor T25 is connected to the output terminal GOUT.

A first electrode of the second scan capacitor C22 is connected to a third scan node N23, and a second electrode of the second scan capacitor C2 is connected to the output terminal GOUT.

A gate electrode of the first noise reduction transistor T26 is connected to the second scan node N2, a first electrode of the first noise reduction transistor T26 is connected to the third power line VGH, and a second electrode of the first noise reduction transistor T26 is connected to a second electrode of the second noise reduction transistor T27.

A gate electrode of the second noise reduction transistor T27 is connected to the second sub-clock signal line GCB, and a first electrode of the second noise reduction transistor T27 is connected to the first scan node N21.

A gate electrode of the voltage stabilizing transistor T28 is connected to the second power line VGL, a second electrode of the voltage stabilizing transistor T28 is connected to the first scan node N21, and a first electrode of the voltage stabilizing transistor T28 is connected to the third scan node N23.

The transistors in the gate scan shift register unit 104 shown in FIG. 1F are all described by using P-type transistors as an example, that is, each transistor is turned on in the case where the gate electrode of the transistor is connected to a low level (turn-on level), and is turned off in the case where the gate electrode of the transistor is connected to a high level (turn-off level). In this case, the first electrode of the transistor may be a source electrode, and the second electrode of the transistor may be a drain electrode.

The gate scan shift register unit includes but is not limited to the configuration shown FIG. 1F. For example, the capacitor C22 in the gate scan shift register unit 104 may be connected between the second scan node N2 and the second clock sub-signal line GCB, a transistor with a similar function to the voltage stabilizing transistor T28 can also be disposed in the second scan node N22. Respective transistors can also use N-type transistors or use P-type transistors and N-type transistors in a mixed manner, it is only necessary to simultaneously connect the port polarity of the selected type of transistor according to the port polarity of the corresponding transistor in the embodiments of the present disclosure.

It should be noted that the working principle of the gate scan shift register unit can refer to the related introduction in the art, and will not be repeated here.

For example, the gate scan signal output by the gate scan driving circuit is maintained at an effective level (for example, a low level) for only a short period of time in one frame, so as to be output to the gate electrode of the data writing transistor M2 in the pixel circuit (for example, the signal terminal GLm) to control the writing of the data signal, that is, the gate scan driving circuit outputs an effective signal during the period in the case where the pixel should write the data signal in one frame, while the light-emitting control signal output by EM GOA remains at an effective level (for example, a low level) for a relatively long period of time in one frame, so as to be output to the light-emitting control signal terminal EM1/EM2 of the light-emitting control transistor M4/M5 in the pixel circuit, to control the pixel to emit light in a relatively long period of time in one frame.

The inventor has noticed that the transistor in the circuit structure will generate a leakage current in the case where the transistor is illuminated by light or is affected by other factors, and the adverse effect of the leakage current in the circuit that needs to maintain an effective signal for a long time such as EM GOA is more serious. Therefore, how to design a new type of driving circuit structure to meet the different output signal requirements of the gate scan driving circuit and the EM GOA, that is, the different requirements for preventing TFT leakage, has become an urgent problem to be solved.

At least one embodiment of the present disclosure provides a display substrate, including: a base substrate, comprising a display region and a peripheral region on at least one side of the display region; and a gate scan driving circuit, a light-emitting control scan driving circuit, and a first power line arranged in the peripheral region of the base substrate and arranged in sequence along a side of the peripheral region away from the display region; the gate scan driving circuit is configured to output a gate scan signal, an output terminal of the light-emitting control scan driving circuit is electrically connected to at least one light-emitting control transistor in the display region, the light-emitting control transistor is configured to control a light-emitting element to emit light in response to the light-emitting control signal, and the first power line is electrically connected to a cathode of at least one light-emitting element in the display region; the gate scan driving circuit comprises a first stabilizing capacitor, a first electrode plate of the first stabilizing capacitor is electrically connected to an output terminal of the gate scan driving circuit, and a second electrode plate of the first stabilizing capacitor is electrically connected to the first power line; and the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically connected to the first power line, the second electrode plate of the second stabilizing capacitor comprises a first part and a second part, and an organic insulation layer is provided between the first part and the second part of the second electrode plate of the second stabilizing capacitor in a direction perpendicular to the base substrate.

At least one embodiment of the present disclosure also provides a display device corresponding to the above-mentioned display substrate and a manufacturing method of the display substrate.

The display substrate provided by the above-mentioned embodiments of the present disclosure can shield the transistors at different positions in the light-emitting control scan driving circuit to different degrees, thereby effectively preventing the generation of leakage current and improving the display quality of the display panel. At the same time, considering that the EM GOA needs to keep outputting an effective signal for a long time, while an effective signal, which is output by the Gate GOA and used for driving the data writing transistor of the pixel circuit to be turned on, has a shorter time, the different structural designs of the first stabilizing capacitor and the second stabilizing capacitor of the above embodiments can effectively improve the driving capability of the EM GOA.

The embodiments of the present disclosure and some examples thereof will be described in detail below with reference to the accompanying drawings.

At least one embodiment of the present disclosure provides a display substrate. FIG. 1E is a schematic diagram of a layout of the light-emitting control shift register unit shown in FIG. 1C on a display substrate; FIG. 2A is a schematic diagram of a layout of the light-emitting control shift register unit 105 shown in FIG. 1C on a display substrate; FIG. 2B is a schematic diagram of a first shielding layer provided by at least one embodiment of the present disclosure; FIG. 2C is a schematic diagram of a second shielding layer provided by at least one embodiment of the present disclosure; FIG. 3A is another schematic diagram of a layout of the light-emitting control shift register unit 105 shown in FIG. 1C on a display substrate; FIG. 3B is a schematic diagram of another first shielding layer provided by at least one embodiment of the present disclosure; FIG. 3C is a schematic diagram of another second shielding layer provided by at least one embodiment of the present disclosure. The display substrate provided by at least one embodiment of the present disclosure will be described in detail below with reference to FIGS. 1E to 3C.

For example, as shown in FIG. 1A and FIG. 2A, the display substrate 1 includes: a base substrate 10 and a gate scan driving circuit 4 and a light-emitting control scan driving circuit 5 provided on the base substrate 10.

For example, as shown in FIG. 1A, the base substrate 10 includes a display region 102 (for example, the display region 102 may also be referred to as a pixel array region) and a peripheral region 106 located on at least one side of the pixel array region. For example, the above-mentioned gate scan driving circuit and light-emitting control scan driving circuit are located in the peripheral region 106 of the base substrate 10 and are arranged in sequence along the side of the peripheral region 106 away from the display region 102, for example, located on one side of the base substrate 10 (as shown in FIG. 1A, between the display region 102 and a side of the base substrate 10), for example, as shown in FIG. 1A, the above-mentioned gate scan driving circuit and light-emitting control scan driving circuit are located on the left side of the display region 102, of course, the above-mentioned gate scan driving circuit and light-emitting control scan driving circuit can also be located on the right side or left and right sides of the display region 102, and the embodiments of the present disclosure are not limited in this aspect. For example, as shown in FIG. 1A, the gate scan driving circuit 4 is located between the light-emitting control scan driving circuit 5 and the display region 102.

For example, the duration of the effective level of the light-emitting control signal output by the light-emitting control scan driving circuit 5 is greater than the duration of the effective level of the gate scan signal output by the gate scan driving circuit 4. For example, the output terminal GOUT of the gate scan driving circuit 4 is connected to at least one data writing transistor (M2 as shown in FIG. 1B) in the display region 102, and the data writing transistor M2 is configured to control the writing of the data signal Vdata in response to the gate scan signal GLm. For example, the output terminal EOUT (for example, the output terminal E021 and the output terminal E022) of the light-emitting control scan driving circuit 5 is connected to at least one light-emitting control transistor (M4 or M5 as shown in FIG. 1B) in the display region 102, the light-emitting control transistor M4/M5 is configured to control the light-emitting element LE to emit light in response to the light-emitting control signal EM1/EM2. For specific introduction, reference may be made to the description of FIG. 1B, and repeated portions will not be repeated here.

For example, as shown in FIG. 2A, the output terminal E021 and the output terminal E022 of the light-emitting control shift register unit 105 of the light-emitting control scan driving circuit 5 are connected to the light-emitting control transistor in the display region 102 through a wiring line that traverses the gate scan shift register unit 104 in the gate scan driving circuit 4. Specifically, the output terminal E021 and the output terminal E022 include a second conductive layer pattern or a third conductive layer pattern connected to the second electrode of the output transistor T9 or the second electrode of the output transistor T10 in the light-emitting control shift register unit 105.

For example, the light-emitting control scan driving circuit 5 includes a plurality of light-emitting control shift register units 105 that are cascaded, it should be noted that FIG. 1E and FIG. 2A only show one light-emitting control shift register unit 105, and the structures of the remaining light-emitting control shift register units 105 in the light-emitting control scan driving circuit 5 are similar to the structures as shown in FIG. 2A and FIG. 1E, and will not be repeated here.

Figure 5A:
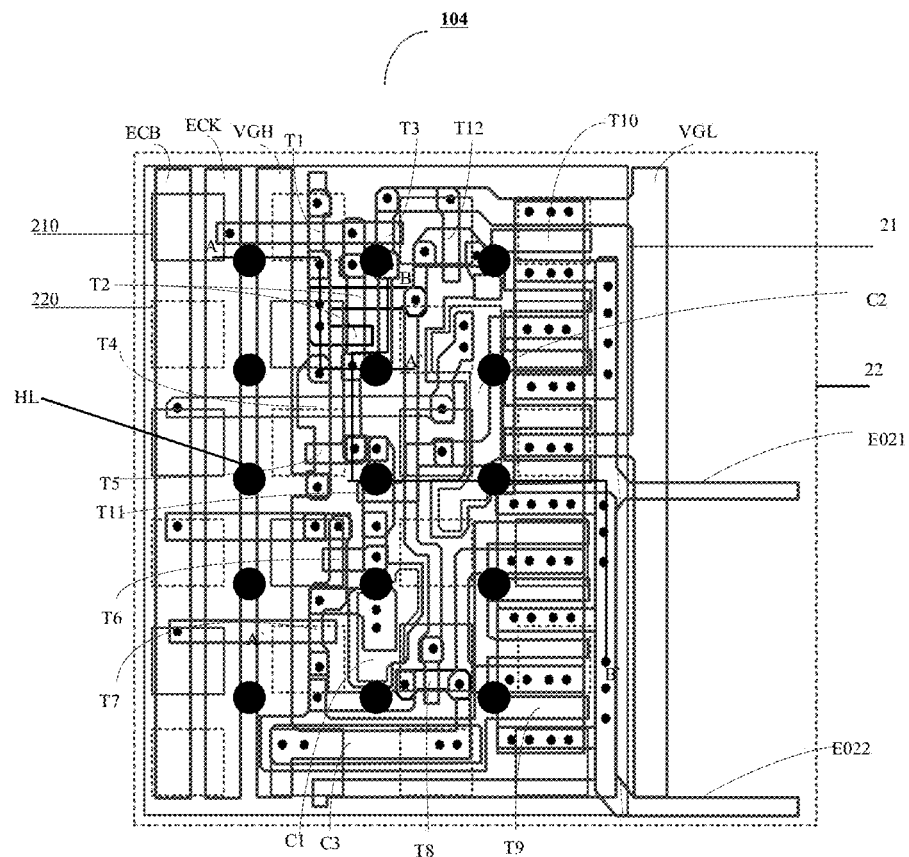
FIG. 5A is a schematic diagram of another display substrate provided by at least one embodiment of the present disclosure.
Figure 5B:
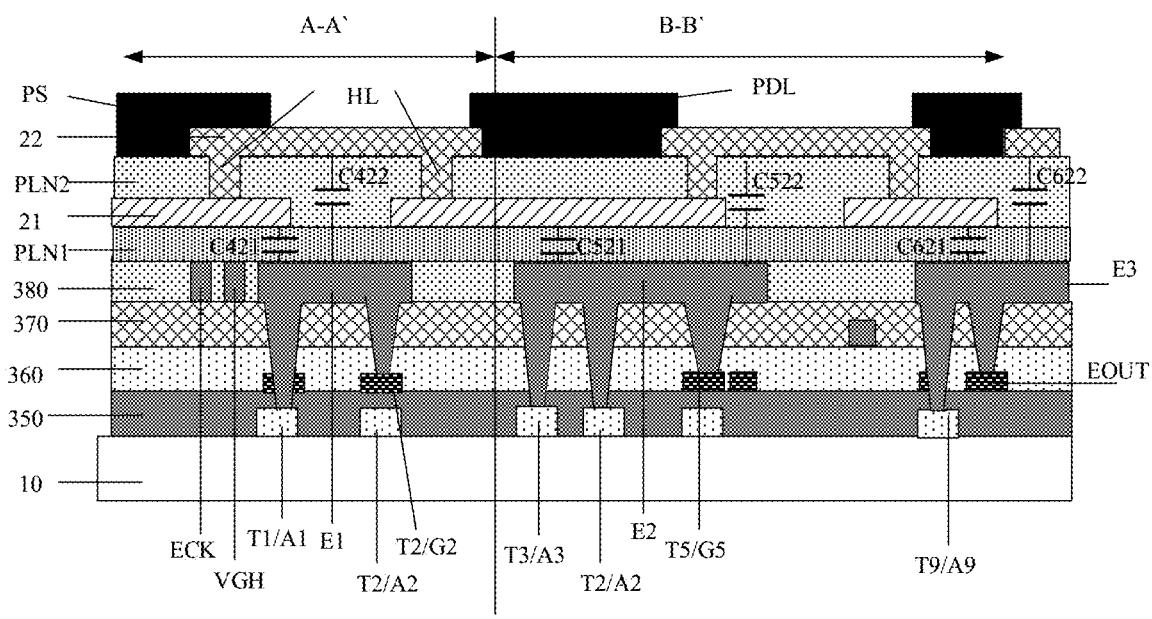
FIG. 5B is a cross-sectional view of the display substrate as shown in FIG. 5A along A-A' and B-B' directions.
Figure 5C:
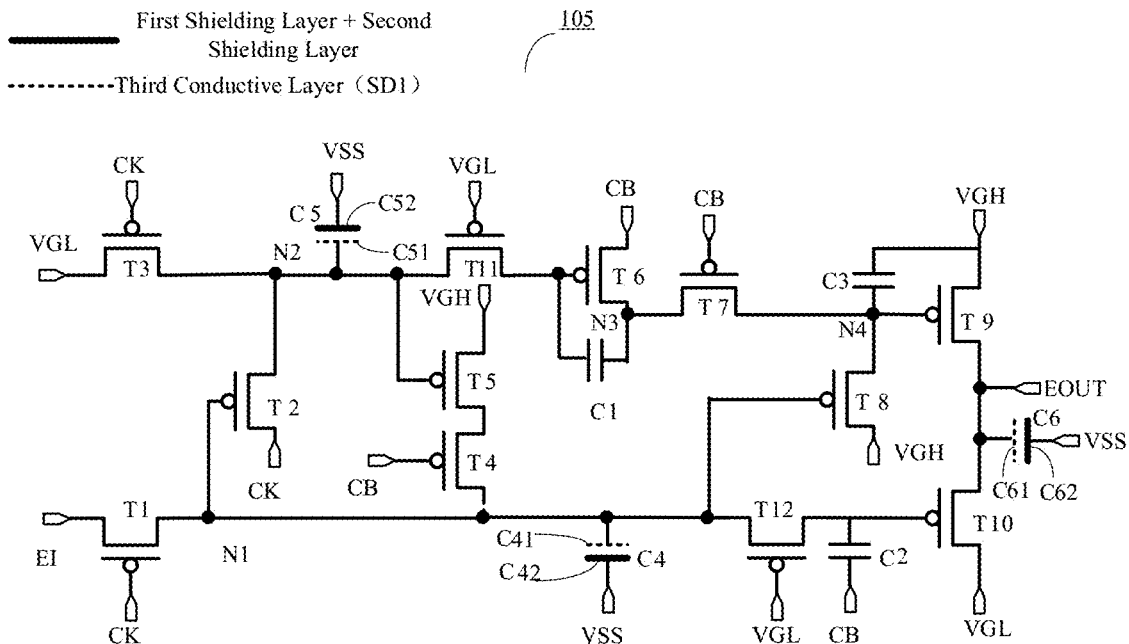
FIG. 5C is a schematic diagram of a light-emitting control shift register unit provided by at least one embodiment of the present disclosure.
Figure 5D:
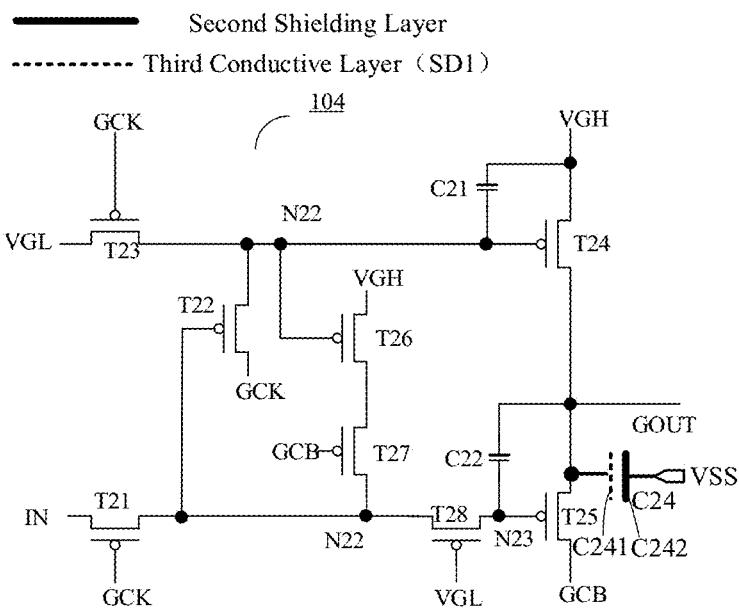
FIG. 5D is a schematic diagram of a gate scan shift register unit provided by at least one embodiment of the present disclosure.

For example, as shown in FIG. 5D, the gate scan driving circuit includes a first stabilizing capacitor C24, a first electrode plate C241 of the first stabilizing capacitor C24 is electrically connected to the output terminal GOUT of the gate scan driving circuit 4, and a second electrode plate C242 of the first stabilizing capacitor C24 is electrically connected to the first power line VSS. Specifically, the output terminal GOUT of the gate scan driving circuit 4 includes a second conductive layer pattern or a third conductive layer pattern connected to the second electrode of the gate output transistor T25 or the second electrode of the output control transistor T24 in the gate scan driving circuit. For example, the first electrode plate refers to an independent and complete pattern located in the peripheral region, can be electrically connected with the signal line of the display region through changing layer or through holes, or it is limited that the two electrode plates do not overlap with the anode of the light-emitting element (different from a peripheral cathode pattern of a small-size).

As shown in FIGS. 5C and 5B, the light-emitting control scan driving circuit 5 includes a second stabilizing capacitor C6, a first electrode plate C61 of the second stabilizing capacitor C6 is electrically connected to the output terminal EOUT of the light-emitting control scan driving circuit 5, a second electrode plate C62 of the second stabilizing capacitor C6 is electrically connected to the first power line VSS, the second electrode plate C62 of the second stabilizing capacitor C6 includes a first part C621 and a second part C622, an organic insulation layer (for example, a second planarization layer PLN2 as shown in FIG. 5B) is provided between the first part C621 and the second part C622 in a direction perpendicular to the base substrate 10.

For example, as shown in FIG. 5C, the light-emitting control scan driving circuit 5 further includes: a third stabilizing capacitor C4, a fourth stabilizing capacitor C5, a first connection portion E1 (as shown in FIG. 1E and FIG. 5B), and a second connection portion E2 (as shown in FIG. 1E and FIG. 5B). For example, the first connection portion E1 includes the first node N1, and the second connection portion E2 includes the second node N2.

For example, as shown in FIGS. 5B and 5C, a first electrode plate C41 of the third stabilizing capacitor C4 is connected to the first connection portion E1 (i.e., the first node N1), a second electrode plate C42 of the third stabilizing capacitor C4 is connected to the first power line VSS, the second electrode plate C42 of the third stabilizing capacitor C4 includes a first part C421 and a second part C422, and an organic insulation layer (for example, the second planarization layer PLN2 as shown in FIG. 5B) is provided between the first part C421 and the second part C422 in a direction perpendicular to the base substrate 10.

For example, a first electrode plate C51 of the fourth stabilizing capacitor C5 is connected to the second connection portion E2 (i.e., the second node N2), a second electrode plate C52 of the fourth stabilizing capacitor C5 is electrically connected to the first power line VSS, the second electrode plate C52 of the fourth stabilizing capacitor C5 includes a first part C521 and a second part C522, and an organic insulation layer (for example, the second planarization layer PLN2 as shown in FIG. 5B) is provided between the first part C521 and the second part C522 in a direction perpendicular to the base substrate 10.

For example, for the detailed structure of the shift register unit 105 of the light-emitting control scan driving circuit 5, reference may be made to the introduction of FIG. 5C, which will not be repeated here.

For example, as shown in FIG. 2A, the display substrate 1 further includes a first shielding layer 21 and a second shielding layer 21 which are sequentially arranged on the side of the light-emitting control scan driving circuit 5 (that is, the light-emitting control shift register unit 105) away from the base substrate 10. For example, the first shielding layer 21 is represented by a solid line frame as shown in FIG. 2A, and the second shielding layer 22 is represented by a dotted line frame as shown in FIG. 2A. The following embodiments are the same as those described herein, and similar portions will not be repeated again. For example, the first shielding layer 21 and the second shielding layer 22 are connected to the first power line VSS to receive the first voltage.

Figure 2A:
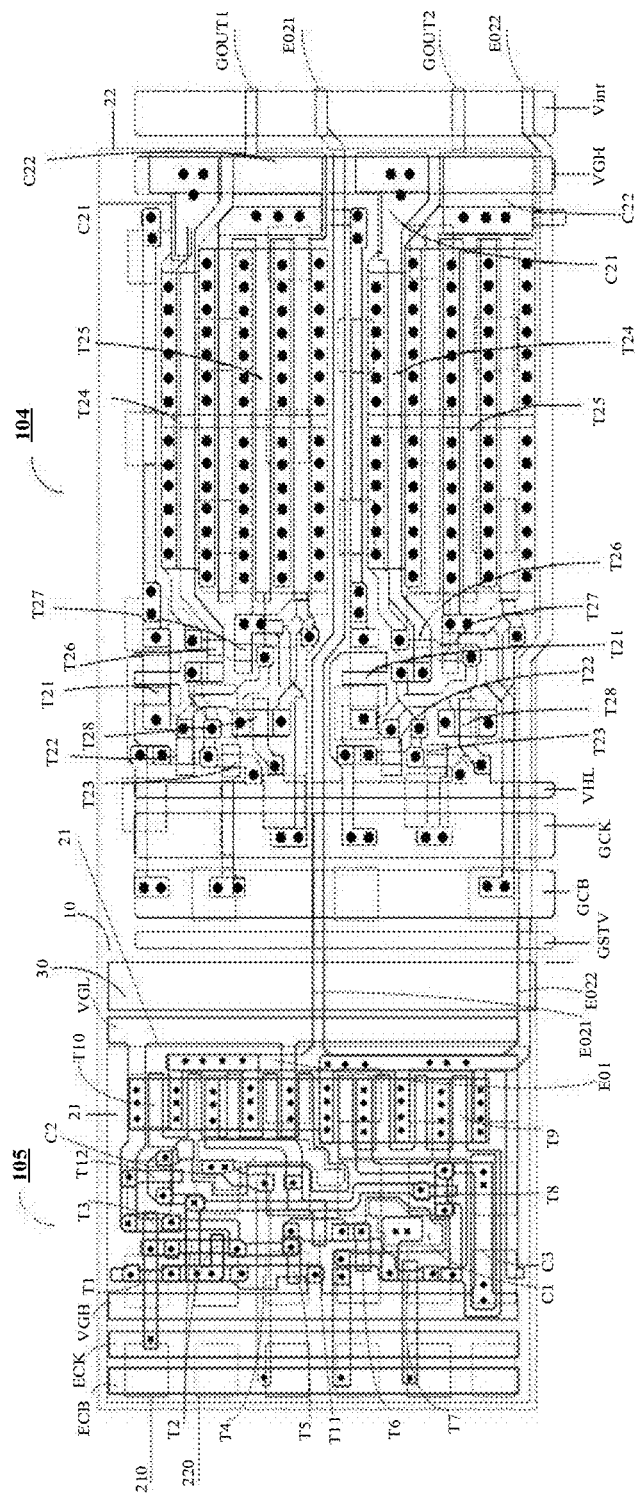
FIG. 2A is a schematic diagram of a layout of the light-emitting control shift register unit 105 shown in FIG. 1C on a display substrate.
Figure 2B:
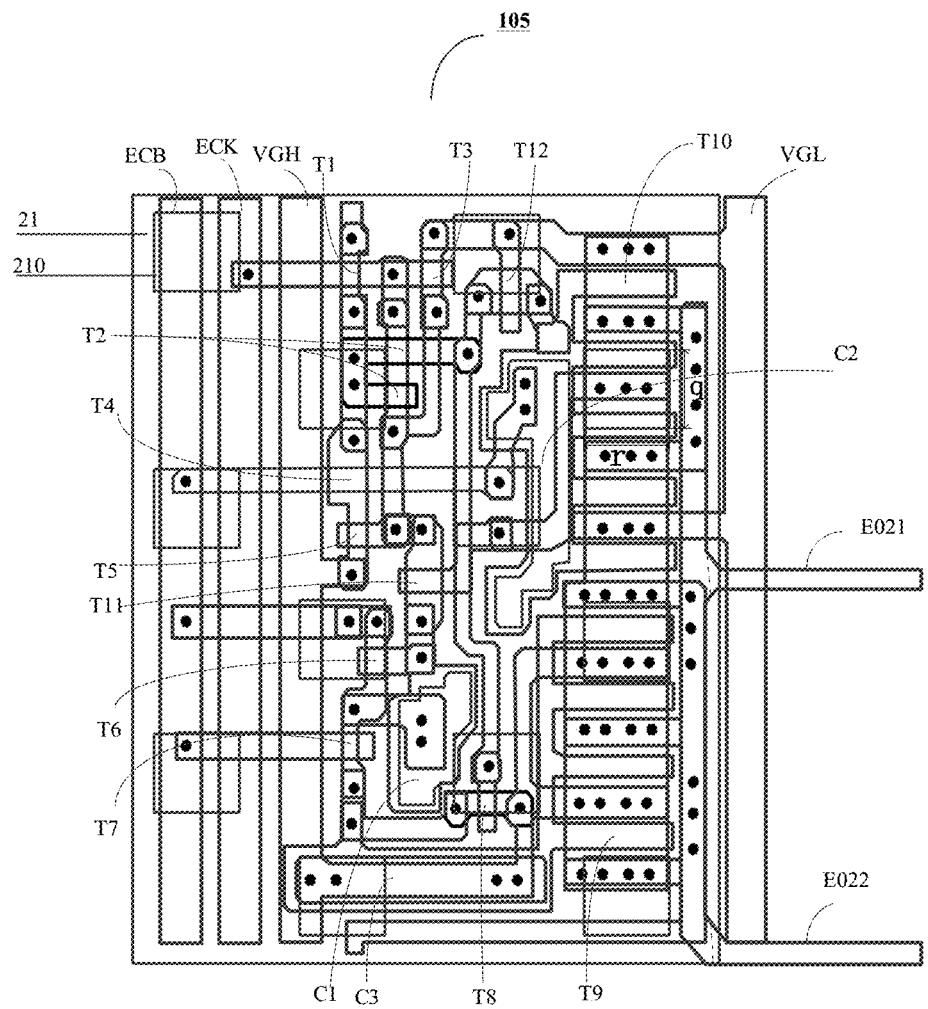
FIG. 2B is a schematic diagram of a first shielding layer provided by at least one embodiment of the present disclosure.
Figure 2C:
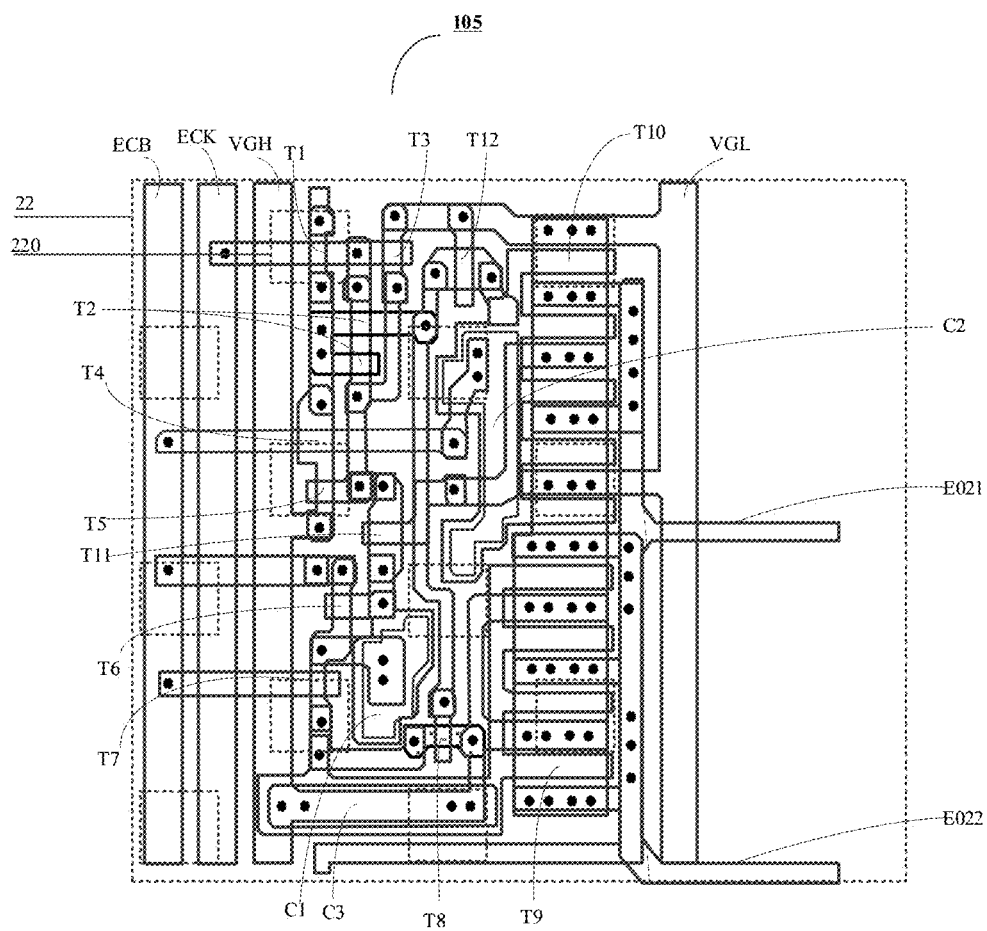
FIG. 2C is a schematic diagram of a second shielding layer provided by at least one embodiment of the present disclosure.
Figure 2D:
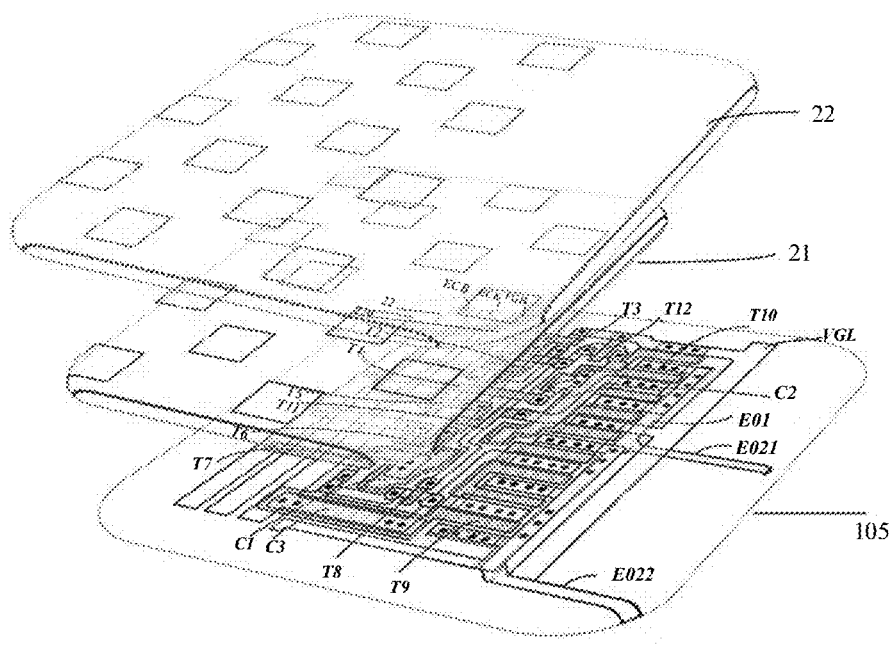
FIG. 2D is an oblique view of the light-emitting control shift register unit 105 shown in FIG. 2A.
Figure 2E:
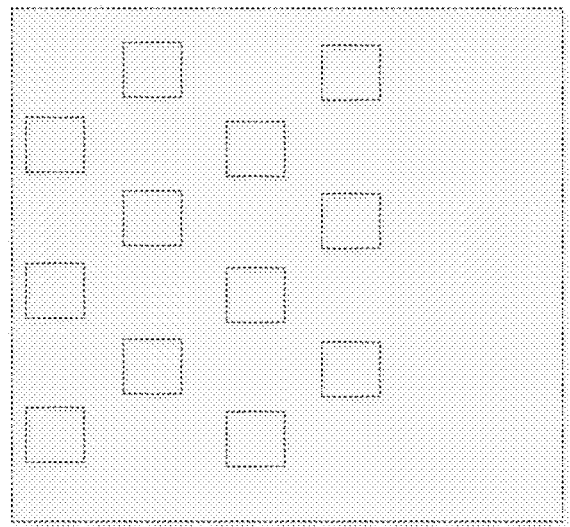
FIG. 2E is a schematic diagram of the second shielding layer of the light-emitting control shift register unit 105 shown in FIG. 2D.
Figure 2F:
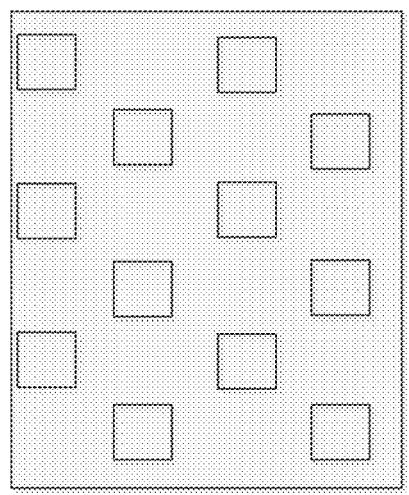
FIG. 2F is a schematic diagram of the first shielding layer of the light-emitting control shift register unit 105 shown in FIG. 2D.
Figure 3A:
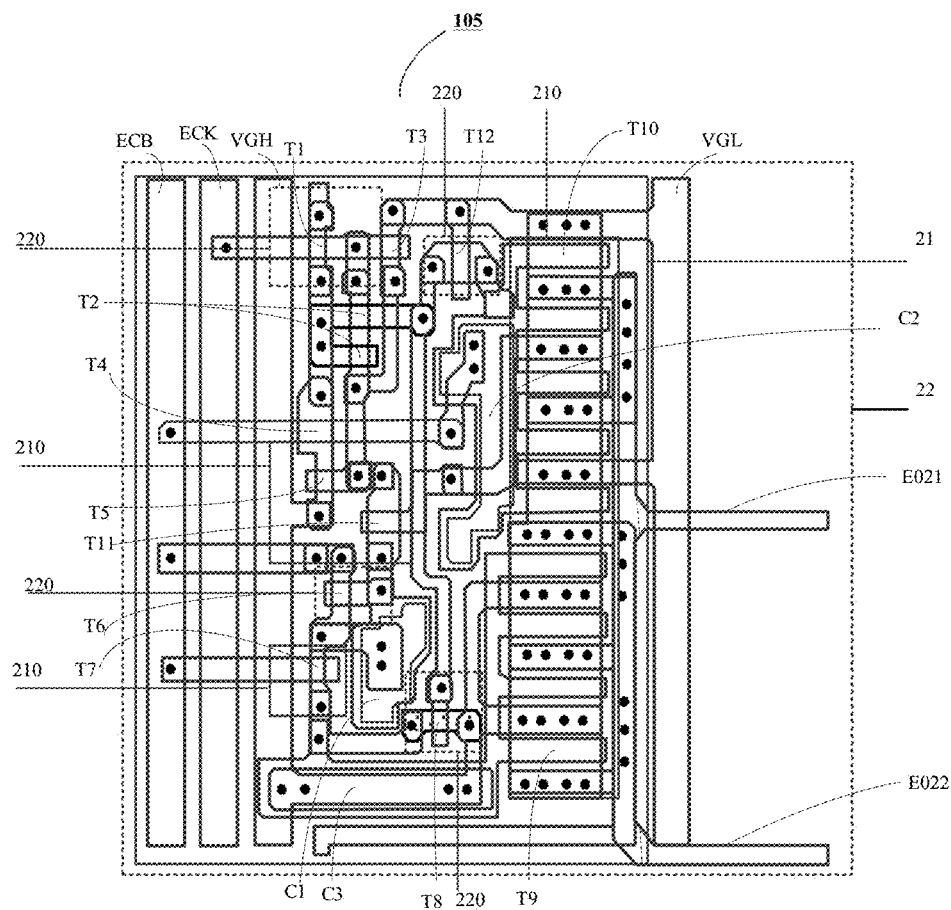
FIG. 3A is another schematic diagram of a layout of the light-emitting control shift register unit 105 shown in FIG. 1C on a display substrate.
Figure 3B:
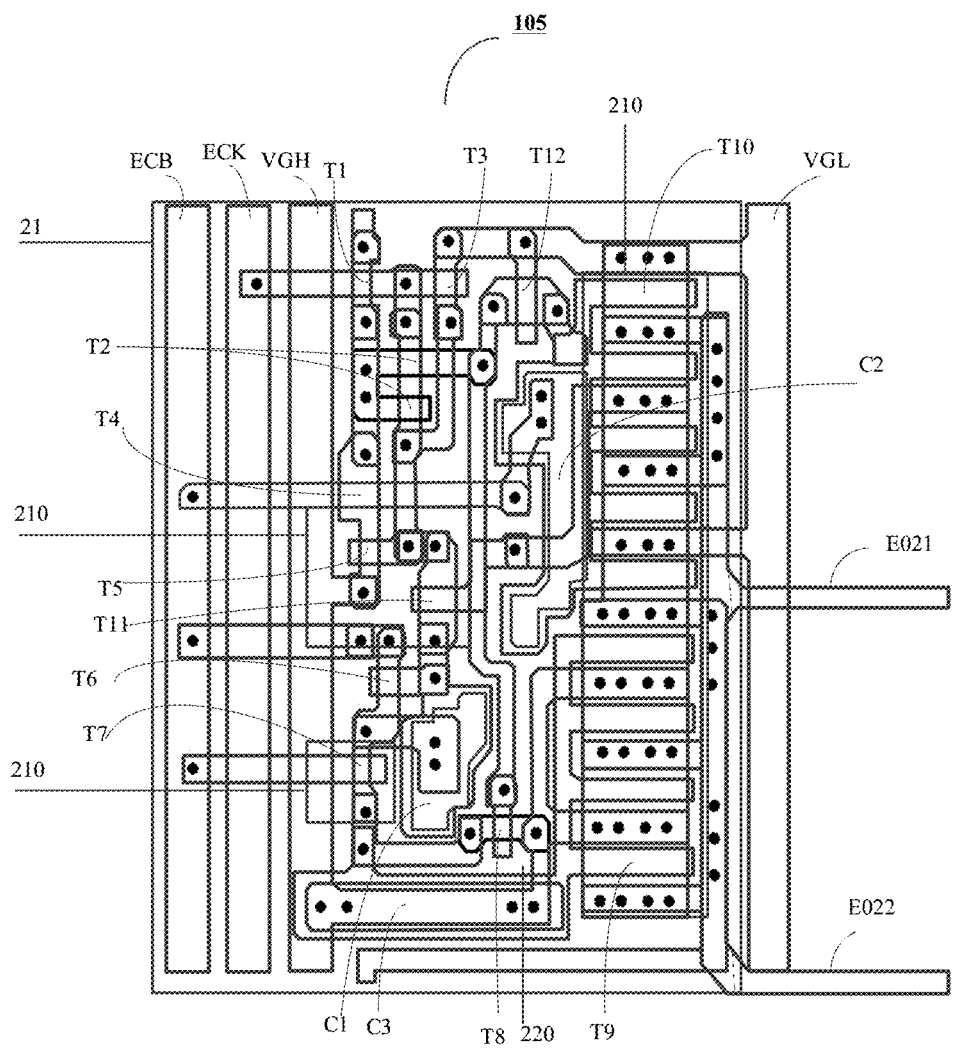
FIG. 3B is a schematic diagram of another first shielding layer provided by at least one embodiment of the present disclosure.
Figure 3C:
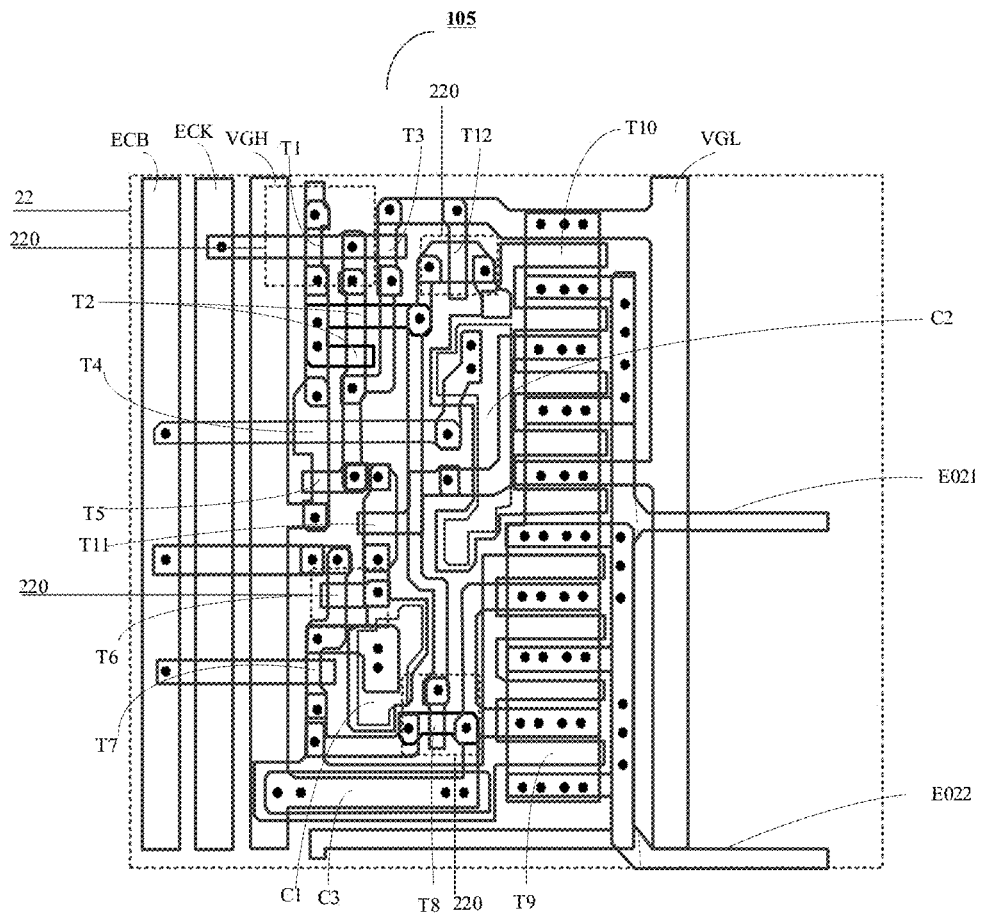
FIG. 3C is a schematic diagram of another second shielding layer provided by at least one embodiment of the present disclosure.

FIG. 2D is an oblique view of the light-emitting control shift register unit 105 shown in FIG. 2A; FIG. 2E is a schematic diagram of the second shielding layer of the light-emitting control shift register unit 105 shown in FIG. 2D; and FIG. 2F is a schematic diagram of the first shielding layer of the light-emitting control shift register unit 105 shown in FIG. 2D. For example, as shown in FIG. 2D, the first shielding layer 21 is located between the light-emitting control shift register unit 105 and the second shielding layer 22.

For example, as shown in FIG. 5B and FIG. 1E, the second stabilizing capacitor C6 (the second electrode plate of the second stabilizing capacitor C6 includes C621 and C622) is located (i.e., formed on) between the first shielding layer 21 as well as the second shielding layer 22 and the third connection portion E3, specifically, the third connection portion E3 includes a third conductive layer pattern connected to the output terminals E021 and E022 of the light-emitting control shift register unit 105. The third stabilizing capacitor C4 (the second electrode plate of the third stabilizing capacitor C4 includes C421 and C422) is located between the first shielding layer 21 as well as the second shielding layer 22 and the first connection portion E1, specifically, the first connection portion E1 includes a third conductive layer pattern connected to the first node N1 of the light-emitting control shift register unit 105, the fourth stabilizing capacitor C5 (the second electrode plate of the fourth stabilizing capacitor C5 includes C651 and C652) is located between the first shielding layer 21 as well as the second shielding layer 52 and the second connection portion E2, specifically, the second connection portion E2 includes a third conductive layer pattern connected to the second node N2 of the light-emitting control shift register unit 105. For example, as shown in FIG. 5B, the first part C621 of the second stabilizing capacitor C6 is a part of the first shielding layer 21, and the second part C622 of the second stabilizing capacitor C6 is a part of the second shielding layer 22. The first part C421 of the third stabilizing capacitor C4 is a part of the first shielding layer 21, and the second part C422 of the third stabilizing capacitor C4 is a part of the second shielding layer 22. The first part C521 of the fourth stabilizing capacitor C5 is a part of the first shielding layer 21, and the second part C522 of the fourth stabilizing capacitor C5 is a part of the second shielding layer 22. That is, the second stabilizing capacitor C6 includes a capacitor formed by the third connection portion E3 and the first shielding layer 21 and a capacitor formed by the third connection portion E3 and the second shielding layer 22, respectively; the third stabilizing capacitor C4 includes a capacitor formed by the first connection portion E1 and the first shielding layer 21 and a capacitor formed by the first connection portion E1 and the second shielding layer 22, respectively; the fourth stabilizing capacitor C5 includes a capacitor formed by the second connection portion E2 and the first shielding layer 21 and a capacitor formed by the second connection portion E2 and the second shielding layer 22, respectively, and the embodiments of the present disclosure are not limited in this aspect.

For example, the first shielding layer 21 covers at least one transistor in the light-emitting control scan driving circuit 5, and the second shielding layer 22 covers at least one transistor among a plurality of transistors except the at least one transistor covered by the first shielding layer 21 in the light-emitting control scan driving circuit 5.

For example, "cover" means that the orthographic projections of the two on the base substrate at least partially overlap, that is, the orthographic projection of the first shielding layer 21 on the base substrate and the orthographic projection of the at least one transistor in the light-emitting control scan driving circuit 5 on the base substrate at least partially overlap, and the orthographic projection of the second shielding layer 22 on the base substrate and the orthographic projection of the at least one transistor among the plurality of transistors except the at least one transistor covered by the first shielding layer 21 in the light-emitting control scan driving circuit 5 on the base substrate at least partially overlap.

For example, as shown in FIG. 2A, the second shielding layer 22 is also located on the side of the gate scan driving circuit 4 away from the base substrate 10, and the second shielding layer 22 covers at least one transistor in the gate scan driving circuit 4, that is, the orthographic projection of the second shielding layer 22 on the base substrate and the orthographic projection of the at least one transistor in the gate scan driving circuit 4 on the base substrate at least partially overlap. For example, as shown in FIG. 2A, the second shielding layer 22 covers the remaining transistors in the gate scan shift register unit 104 except the first control transistor T21. The embodiments of the present disclosure are not limited in this aspect.

Figure 1G:
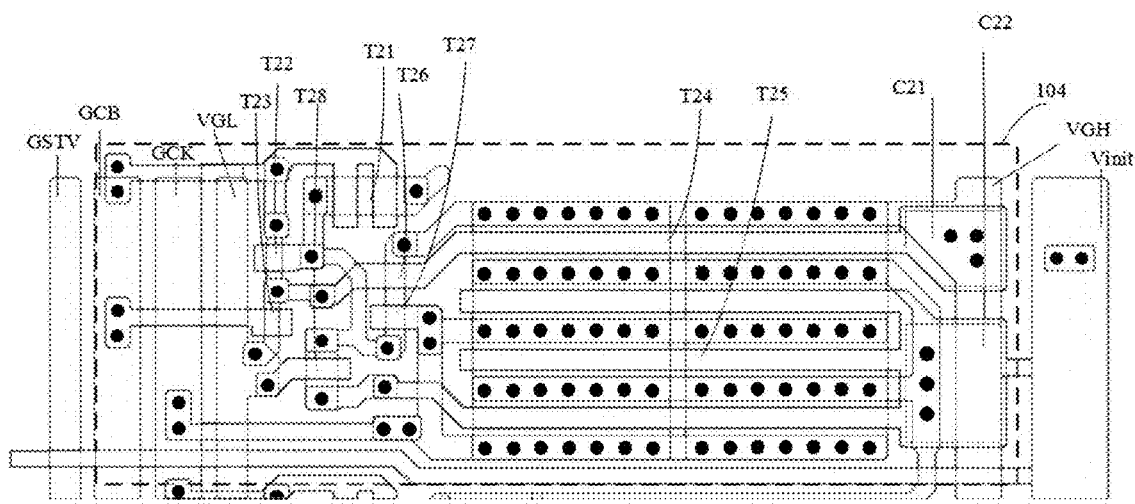
FIG. 1G is a schematic diagram of a layout of a gate scan shift register unit on a display substrate provided by at least one embodiment of the present disclosure.

For example, the arrangement mode of the gate scan shift register units 104 in the gate scan driving circuit 4 is as shown in FIG. 1G. Of course, the gate scan shift register units 104 in the gate scan driving circuit 4 may also adopt other layout modes, and the embodiments of the present disclosure are not limited in this aspect.

For example, as shown in FIG. 2A, taking a light-emitting control shift register unit 105 as an example, the first shielding layer 21 covers at least one transistor in the light-emitting control shift register unit 105 (for example, covering the transistors T1, T3, T4, and T11), the second shielding layer 22 covers at least one transistor of the plurality of transistors (for example, covering the transistors T2, T3, T6, T11, and T12) except the above-mentioned at least one transistor (for example, the above-mentioned transistors T1, T3, T4, and T11) in the light-emitting control shift register unit 105.

Therefore, the display substrate provided by the above-mentioned embodiments of the present disclosure can shield the transistors at different positions in the light-emitting control scan driving circuit 5 to different degrees, thereby effectively preventing the generation of leakage current and improving the display quality of the display panel.

For example, as shown in FIG. 1E, the display substrate 1 further includes: a first power line VSS, which is, for example, connected to the cathode of the light-emitting element LE in the pixel circuit of the display region 102 shown in FIG. 1B. For example, the light-emitting control shift register unit 10 further includes a second power line VGL, a third power line VGH, and a plurality of clock signal lines (the first clock signal line ECK, the second clock signal line ECB, and the trigger signal line ESTV shown in the figure). For convenience and conciseness, the light-emitting control shift register unit 105 will be referred to as a shift register unit for short below for introduction.

For example, the second power line VGL, the first power line VSS, the third power line VGH, and the plurality of clock signal lines (for example, the first clock signal line ECK, the second clock signal line ECB, and the trigger signal line ESTV) extend in the first direction Y on the base substrate 10, and are configured to respectively provide a second voltage, a first voltage, a third voltage, and a plurality of clock signal (for example, the above-mentioned first clock signal, second clock signal, or trigger signal, etc.) to the shift register unit 105. For example, the second power line VGL is configured to provide the second voltage to the shift register unit 105, and the third power line VGH is configured to provide the third voltage to the shift register unit 105; the first clock signal line ECK and the second clock signal line ECB are configured to provide the first clock signal or the second clock signal to the shift register unit 105, respectively. For example, the second voltage is smaller than the third voltage, for example, the second voltage is a DC low level, and the third voltage is a DC high level. The specific connection relationship between the second power line VGL, the third power line VGH, as well as the plurality of clock signal lines and the shift register unit 105 can refer to the following description. For example, an absolute value of the second voltage provided by the second power line VGL is greater than an absolute value of the first voltage provided by the first power line VSS, for example, the second voltage is approximately −7 volts (V), and the first voltage is approximately −3V. It should be noted that the values of the second voltage and the first voltage may be determined according to specific conditions, and the embodiments of the present disclosure are not limited in this aspect.

It should be noted that the second power line VGL, the first power line VSS, the third power line VGH, and the plurality of clock signal lines can be arranged in parallel along the first direction Y, or can cross each other at a certain angle (for example, less than or equal to 20°), and the embodiments of the present disclosure are not limited in this aspect.

For example, the base substrate 10 may be made of, for example, glass, plastic, quartz, or other suitable materials, and the embodiments of the present disclosure are not limited in this aspect.

For example, the orthographic projection of the second power line VGL on the base substrate 10 is located on a side of an orthographic projection of the transistor (for example, the shift register unit 105) included in the light-emitting control scan driving circuit 5 on the base substrate 10 close to the display region 102, for example, in the second direction X, the orthographic projection of the second power line VGL on the base substrate 10 is located on the right side of the shift register unit 105 shown in FIG. 2A, that is, is located between the orthographic projection of the shift register unit 105 on the base substrate 10 and the orthographic projection of the shift register unit 104 included in the gate scan driving circuit on the base substrate 10; the orthographic projection of the first power line VSS on the base substrate 10 is located on the side of the orthographic projection of the light-emitting control scan driving circuit 5 on the base substrate 10 away from the display region 102.

For example, the orthographic projection of the third power line VGH and the orthographic projections of the plurality of clock signal lines on the base substrate 10 are located on the side of the orthographic projection of the transistor included in the shift register unit 105 on the base substrate 10 away from the display region 102, for example, in the second direction X, the orthographic projection of the third power line VGH and the orthographic projections of the plurality of clock signal lines on the base substrate 10 are all located on the left side of the shift register unit 105 shown in FIG. 2A. That is, the orthographic projection of the shift register unit 105 on the base substrate 10 is located between the orthographic projection of the second power line VGL on the base substrate 10 and the orthographic projection of the first power line VSS on the base substrate 10.

For example, as shown in FIG. 2A, the second power line VGL and the first power line VSS are located on the side of the first shielding layer 21 away from the second shielding layer 22 in a direction perpendicular to the base substrate 10, and therefore, the first shielding layer 21 is away from the second shielding layer 22 and covers the light-emitting control scan driving circuit 5 and the second power line VSS to achieve shielding.

For example, as shown in FIG. 2A, the orthographic projection of the third power line VGH on the base substrate 10 is located between the orthographic projections of the first clock signal line ECK and the second clock signal line ECB on the base substrate 10 and the orthographic projection of the shift register unit 105 on the base substrate 10. For example, the trigger signal line (not shown in the figure), the second clock signal line ECB, and the first clock signal line ECK are sequentially arranged on the base substrate 10 along the second direction X from left to right.

It should be noted that the above-mentioned wiring positions are only exemplary, as long as it can be satisfied that the wiring lines are arranged to facilitate the connection with the shift register unit, and the embodiments of the present disclosure are not limited in this aspect.

For example, the positions of the second power line VGL and the third power line VGH are not limited to the above wiring positions, the orthographic projection of the second power line VGL on the base substrate 10 may be located on the side of the orthographic projection, away from the display region 102, of the transistor (for example, the shift register unit 105) included in the light-emitting control scan driving circuit 5 on the base substrate 10, for example, in the second direction X, is located on the left side of the shift register unit 105 shown in FIG. 2A, the orthographic projection of the third power line VGH on the base substrate 10 may be located on the side of the orthographic projection, close to the display region 102, of the transistor included in the shift register unit 105 on the base substrate 10, for example, in the second direction X, is located on the right side of the shift register unit 105 shown in FIG. 2A.

For example, an included angle between the first direction Y and the second direction X is between 70° and 90°, and includes 70° and 90°. For example, the included angle between the first direction Y and the second direction X is 70°, 75°, 85°, 90°, or 80°, etc., the included angle between the first direction Y and the second direction X can be set according to actual conditions, and the embodiments of the present disclosure are not limited in this aspect. In the following, the case that the first direction Y and the second direction X are perpendicular to each other is taken as an example to describe the present disclosure the embodiments of the present disclosure are not limited in this aspect.

For example, the display region 102 includes a plurality of pixel units 103 arranged in an array. For example, each of the plurality of pixel units 103 includes a pixel circuit, for example, may further include a light-emitting element (not shown in the figure).

For example, a plurality of shift register units 105 are cascaded to constitute the light-emitting control scan driving circuit (EM GOA). For example, the output terminals EOUT of the plurality of shift register units 105 are respectively connected to the light-emitting control signal terminals EM1 and EM2 of the light-emitting control transistors M4 and M5 of respective rows of pixel circuits (as shown in FIG. 1B) located in the pixel array region to provide output signals (for example, light-emitting control signals) to the respective rows of pixel circuits, thereby driving the light-emitting elements to emit light. For example, the pixel circuit is not limited to the circuit structure of 7T1C shown in FIG. 1B, and may also be a pixel circuit in the art including a circuit structure such as 2T1C, 4T2C, 8T2C, etc., which will not be repeated here.

FIG. 1E only shows an X-th stage of shift register unit 105 in the light-emitting control scan driving circuit. For example, the first clock signal terminal CK (as shown in FIG. 1C) of a first stage of shift register unit (not shown in the figure) is connected to the first clock signal line ECK to receive the first clock signal, the second clock signal terminal CB of the first stage of shift register unit 105 is connected to the second clock signal line ECB to receive the second clock signal, the first clock signal terminal CK of the second stage of shift register unit (not shown in the figure) is connected to the second clock signal line ECB to receive the first clock signal, the second clock signal terminal CB of the second stage of shift register unit is connected to the first clock signal line ECK to receive the second clock signal, and so on. As shown in FIG. 1E, the first clock signal terminal CK of an X-th (X is an odd number greater than or equal to 1) stage of shift register unit 105 is connected to the first clock signal ECK to receive the first clock signal, the second clock signal terminal CB of the X-th stage of shift register unit 105 is connected to the second clock signal line ECB to receive the second clock signal, the first clock signal terminal CK of a (X+1)-th stage of shift register unit is connected to the second clock signal line ECB to receive the first clock signal, and the second clock signal terminal CB of the (X+1)-th stage of shift register unit is connected to the first clock signal line ECK to receive the second clock signal. It should be noted that the connection mode of the shift register units at various stages and the clock signal lines can also adopt other connection modes in the art, and the specifics may be determined according to the actual situation, for example, specifics is determined according to the number of signal lines, etc., and the embodiments of the present disclosure are not limited in this aspect. For example, the input terminal EI of the first stage of shift register unit is connected to the trigger signal line ESTV to receive the trigger signal as the input signal, the input terminal of the second stage of shift register unit 105 is connected to the output terminal EOUT of the previous stage of shift register unit (i.e., the first stage of shift register unit), the connection mode of the shift register units at other stages is similar to this case. The following takes the structure of the X-th stage of shift register unit 105 as an example for description, and the embodiments of the present disclosure are not limited in this aspect.

For example, as shown in FIG. 1E, the first transistor T1, the third transistor T3, and the twelfth transistor T12 are arranged side by side in the second direction X, the orthographic projection of the second transistor T2 on the base substrate is between the orthographic projection of the first transistor T1 on the base substrate and the orthographic projection of the third transistor T3 on the base substrate, the fourth transistor T4 and the fifth transistor T5 are integrally formed and are located on an imaginary line of the first transistor T1 in the first direction Y, the sixth transistor T6 and the seventh transistor T7 are integrally formed and are located on an imaginary line of the fifth transistor T5 in the first direction Y, the eleventh transistor T11 is located on an imaginary line of the third transistor T3 in the first direction Y, and the eleventh transistor T11 and the fifth transistor T5 are arranged side by side in the second direction X, the first capacitor C1 is located on an extension line of the eleventh transistor T11 in the first direction Y, and the third capacitor C3 is located on the side of the second capacitor C2 away from the eleventh transistor T11, the second capacitor C2 is located on an extension line of the twelfth transistor T12 in the first direction Y, the eighth transistor T8 is located between the second capacitor C2 and the third capacitor C3, the ninth transistor T9 and the tenth transistor T10 are integrally arranged and extend along the first direction Y, and are located between the second capacitor C2 and the second power line VGL.

For example, as shown in FIG. 2B, the orthographic projection of an edge of the first shielding layer 21 close to the display region 102 on the base substrate 10 is located on the side of the orthographic projection of the second power line VGL on the base substrate 10 away from the display region 102. For example, the orthographic projection of an edge of the first shielding layer 21 away from the display region 102 on the base substrate 10 overlaps with the orthographic projection of the first power line VSS on the base substrate, to ensure that the transistors of the shift register unit 105 are completely covered to prevent the transistors from generating leakage current.

For example, as shown in FIG. 2B, the light-emitting control scan driving circuit 105 includes a plurality of output transistors T9, which are configured to output light-emitting control signals to the light-emitting control transistors M4 and M5 of the display region 102 row by row. For details, reference may be made to the introductions of FIG. 1C and FIG. 1E, which will not be repeated here.

For example, as shown in FIG. 2B, the orthographic projection of the edge of the first shielding layer 21 close to the display region 102 on the base substrate 10 is located between the orthographic projection of the plurality of output transistors T9 on the base substrate 10 and the orthographic projection of the second power line VGL on the base substrate 10, so as to achieve to cover the transistors included in the light-emitting control scan driving circuit 105 to prevent the leakage current from generating.

For example, as shown in FIG. 2C, the orthographic projection of the edge of the second shielding layer 22 close to the display region 102 on the base substrate 10 overlaps with the orthographic projection of the gate scan driving circuit 4 on the base substrate 10. For example, the orthographic projection of the edge of the second shielding layer 22 away from the display region 102 on the base substrate 10 overlaps with the orthographic projection of the first power line VSS on the base substrate 10, so as to achieve to cover the transistors included in the light-emitting control scan driving circuit 105 to prevent the leakage current from generating.

For example, the orthographic projection of the edge of the second shielding layer 22 close to the display region 102 on the base substrate 10 overlaps with the orthographic projection of the output transistor T25, which outputs the gate scan signal, of the gate scan driving circuit 4 on the base substrate 10; or, as shown in FIG. 2A, the orthographic projection of the edge of the second shielding layer 22 close to the display region 102 on the base substrate 10 overlaps with the orthographic projection of an edge of the gate scan driving circuit 4 close to the display region 4 on the base substrate 10, that is, the second shielding layer 22 covers the entire gate scan driving circuit 5, and the embodiments of the present disclosure are not limited to this case. For example, the circuit structure and layout of the gate scan driving circuit 4 can adopt the settings in this field, which will not be repeated here.

It should be noted that, for clarity and conciseness, the gate scan shift register unit 104 is omitted in FIGS. 2B to 3C, and the specific covering method of the gate scan shift register unit 104 can refer to the description in FIG. 2A.

It should be noted that the arrangement mode of the transistors in the gate scan shift register unit 104 is not limited to the position arrangement shown in FIG. 2A, other forms of laminated structure can also be adopted, which will not be repeated here. The embodiments of the present disclosure do not limit this.

Corresponding to each light-emitting control shift register unit 105, for example, the light-emitting control shift register unit 105 shown in FIG. 2B and FIG. 2C is taken as an example for description, the structures of the other light-emitting control shift register units are similar to this case, and will not be described in detail.

For example, as shown in FIGS. 2B and 2C, the first shielding layer 21 includes a plurality of first openings 210 arranged periodically (as shown by solid-line rectangular frames in FIG. 2B), a size of the first opening C210 is q*r, where q is a size of the first opening along the first direction, and r is a size of the first opening along the second direction, the second shielding layer 22 includes a plurality of second openings 220 periodically arranged (as shown by the dashed-line rectangular frames in FIG. 2C), so that the first shielding layer 21 and the second shielding layer 22 respectively cover at least part of the transistors of the light-emitting control shift register unit 105. For example, as shown in FIG. 2B, the first shielding layer 21 covers the transistors T1, T3, T4, and T11 of the light-emitting control shift register unit 105. For example, as shown in FIG. 2C, the second shielding layer 22 covers the transistors T2, T3, T6, T11, and T12 of the light-emitting control shift register unit 105. Because a planarization layer is disposed under the first shielding layer 21 and the second shielding layer 22, the planarization layer can also be deflated through the first opening and the second opening.

It should be noted that the number and positions of the transistors respectively covered by the first shielding layer 21 and the second shielding layer 22 may be determined according to specific conditions, and the embodiments of the present disclosure are not limited in this aspect.

It should be noted that the plurality of first openings 210 arranged periodically means that in one light-emitting control shift register unit 105, the sizes of the plurality of first openings 210 are the same and the spacing of the plurality of first openings 210 is fixed, the plurality of second openings 220 periodically arranged means that in one light-emitting control shift register unit 105, the sizes of the plurality of second openings 220 are the same and the spacing of the plurality of second openings 220 is fixed.

For example, in some examples, a density of the plurality of first openings 210 ranges from 10% to 50%, and a density of the plurality of second openings 220 ranges from 10% to 50%. For example, the density of the plurality of first openings 210 and the density of the plurality of second openings 220 may be the same, and may both be 30%, for example, may also be 10% or 50%, etc., or may also be 15%, 35%, 45% etc., of course, the density of the plurality of first openings 210 and the density of the plurality of second openings 220 may also be different, and the specifics may be determined according to the actual situation, and the embodiments of the present disclosure are not limited in this aspect.

For example, the density refers to a ratio of an area of each opening to a projection area of a shift register unit 105.

For example, in some examples, a shape of each of the plurality of first openings 210 and a shape of each of the plurality of second openings 220 are rectangles, such as squares, of course, can also be circles, diamonds, and other regular or irregular shapes. The embodiments of the present disclosure are not limited in this aspect.

For example, in some examples, the size of each of the plurality of first openings 210 and the size of each of the plurality of second openings 220 range from 10 μm*10 μm to 20 μm*20 μm. For example, the size of each of the plurality of first openings 210 and the size of each of the plurality of second openings 220 are the same, for example, both are 15 μm*15 μm, of course, can also be 10 μm*10 μm, 16 μm*16 μm, 20 μm*20 μm, or the like, the embodiments of the present disclosure are not limited in this aspect. It should be noted that the sizes of the plurality of first openings 210 and the plurality of second openings 220 may also be different, the specifics may be determined according to the actual situations, and the embodiments of the present disclosure are not limited in this aspect.

For example, in other examples, corresponding to each light-emitting control shift register unit, for example, as shown in FIGS. 3B and 3C, the first shielding layer 21 includes a plurality of first openings 210 arranged non-periodically (as shown by the solid-line rectangular frames in FIG. 3B), the second shielding layer 22 includes a plurality of second openings 220 arranged non-periodically (as shown by the dashed-line rectangular frames in FIG. 3C), so that the first shielding layer 21 and the second shielding layer 22 respectively cover at least part of the transistors of the light-emitting control shift register unit 105.

For example, as shown in FIG. 3B, the first shielding layer 21 covers the transistors T1, T2, T3, T4, T6, T8, and T12 in the light-emitting control shift register unit 105. For example, as shown in FIG. 3C, the second shielding layer 22 covers the transistors T5, T7, T9, T10, and T11 of the light-emitting control shift register unit 105.

It should be noted that the number and positions of the transistors respectively covered by the first shielding layer 21 and the second shielding layer 22 may be determined according to specific conditions, and the embodiments of the present disclosure are not limited in this aspect.

It should be noted that the plurality of first openings 210 arranged non-periodically means that in one light-emitting control shift register unit 105, the sizes of the plurality of first openings 210 are variable and the spacing of the plurality of first openings 210 is variable, the plurality of second openings 220 non-periodically arranged means that in one light-emitting control shift register unit 105, the sizes of the plurality of second openings 220 are variable and the spacing of the plurality of second openings 220 is variable.

For example, in some examples, the density of the plurality of first openings 210 ranges from 10% to 25%, and the density of the plurality of second openings 220 ranges from 10% to 25%. For example, the density of the plurality of first openings 210 and the density of the plurality of second openings 220 may be the same, and may both be 20%, for example, 10% or 25%, etc., or 15%, etc., of course, the density of the plurality of first openings 210 and the density of the plurality of second openings 220 may also be different. For example, the density of the plurality of first openings 210 is 10%, and the density of the plurality of second openings 220 is 20%, the specifics may be determined according to actual conditions, and the embodiments of the present disclosure are not limited in this aspect.

For example, the density refers to the ratio of the area of each opening to the projection area of a shift register unit 105.

For example, in some examples, the shape of each of the plurality of first openings 210 and the shape of each of the plurality of second openings 220 are rectangles, such as squares, of course, can also be circles, diamonds, and other regular or irregular shapes. The embodiments of the present disclosure are not limited in this aspect.

For example, in this example, the sizes of the plurality of first openings 210 and the plurality of second openings 220 are positively correlated with the areas of transistors respectively corresponding the plurality of first openings 210 and the plurality of second openings 220. For example, in the case where a first opening 210 corresponds to the fifth transistor T5 and the eleventh transistor T11, and the other first opening 210 corresponds to the seventh transistor T7, because the area of the fifth transistor T5 and the eleventh transistor T11 is larger than the area of the seventh transistor T7, therefore, the size of the first opening 210 corresponding to the fifth transistor T5 and the eleventh transistor T11 is larger than the size of the first opening 210 corresponding to the seventh transistor T7, and the determination of the size of the second opening 220 is similar to this case, and will not be repeated here.

For example, as shown in FIGS. 2A to 3C, the orthographic projections of the edges of the plurality of first openings 210 on the base substrate 10 do not overlap with the orthographic projections of the edges of the plurality of second openings 220 on the base substrate 10, and the plurality of first openings 210 and the plurality of second openings 220 are alternately arranged, so as to achieve that different shielding layers shield different transistors to prevent the leakage current of the transistors.

Figure 4:
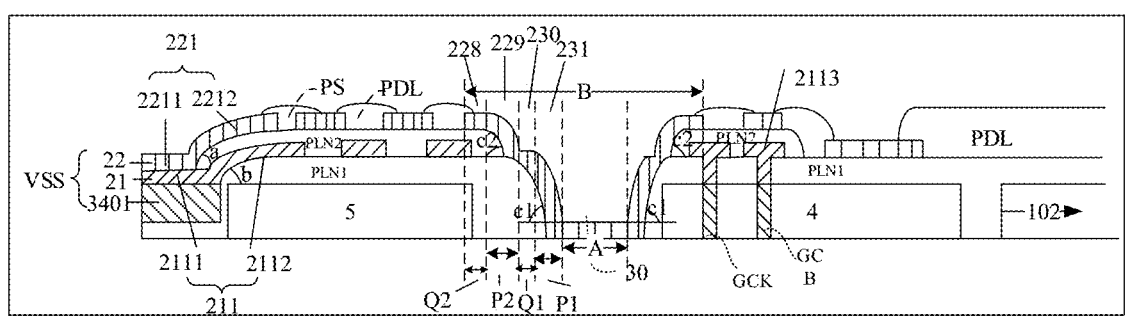
FIG. 4 is a cross-sectional view of a display substrate provided by at least one embodiment of the present disclosure.

FIG. 4 is a cross-sectional view of a display substrate provided by at least one embodiment of the present disclosure.

For example, as shown in FIG. 4, the display substrate 1 further includes a first planarization layer PLN1 and a second planarization layer PLN2. For example, the first planarization layer PLN1 is located on the side of the first shielding layer 21 away from the second shielding layer 22 in the direction perpendicular to the base substrate 10, that is, is between the first shielding layer 21 and the light-emitting control scan driving circuit EMGOA; the second planarization layer PLN2 is located between the first shielding layer 21 and the second shielding layer 22 in a direction perpendicular to the base substrate 10.

For example, as shown in FIG. 4, the portion 211 of the first shielding layer 21 away from the display region 102 includes a first part 2111 and a second part 2112 located on the side of the first planarization layer PLN1 away from the base substrate 10, the portion 221 of the second shielding layer 22 away from the display region 102 includes a first part 2211 and a second part 2212 located on the side of the second planarization layer PLN2 away from the base substrate 10.

For example, as shown in FIG. 4, the first part 2111 and the second part 2112 of the first shielding layer 21 are integrally formed, and the first part 2211 and the second part 2212 of the second shielding layer 22 are integrally formed.

For example, the first power line VSS is located in the third conductive layer, and the first power line VSS is integrally formed with the first part 2111 of the first shielding layer 21 and the second part 2211 of the second shielding layer 22, that is, the first power line VSS includes a portion 3401 of the third conductive layer away from the display region 102, the first part 2111 of the first shielding layer 21, and the first part 2211 of the second shielding layer 22, and the portion 3401 of the third conductive layer away from the display region 102 is in direct contact with the first part 2111 of the first shielding layer 21 and the first part 2211 of the second shielding layer 22, so that the first shielding layer 21, the second shielding layer 22, and the portion 3401 of the third conductive layer 102 are all used as the first power line VSS for transmitting the first voltage, so as to increase the wiring thickness of the first power line VSS, thereby reducing the wiring resistance of the first power line VSS.

For example, an included angle b between the second part 2112 of the first shielding layer 22 and the third conductive layer ranges from 20° to 30°, for example, may be 20°, 30°, or 25°, an included angle α between the second part 2212 of the second shielding layer 22 and the third conductive layer ranges from 25° to 40°, for example, may be 25°, 30°, or 40°. The embodiments of the present disclosure are not limited in this aspect.

For example, the second shielding layer 22 is connected to the first shielding layer 21 through a hole HL penetrating through the second planarization layer PLN2, the first shielding layer 21 is connected to the first power line VSS (for example, as shown in FIG. 4, the first power line VSS includes the portion 3401 of the third conductive layer away from the display region 102, the first part 2111 of the first shielding layer 21, and the first part 2211 of the second shielding layer 22, and the portion 3401 of the third conductive layer away from the display region 102 is in direct contact with the first part 2111 of the first shielding layer 21 and the first part 2211 of the second shielding layer 22), so that the first voltage provided by the first power line VSS can be uniformly applied to the first shielding layer 21 and the second shielding layer 22, thereby enabling the portion 3401 of the third conductive layer, the first shielding layer 21, and the second shielding layer 22 all to transmit the first voltage, while increasing the thickness of the first power line VSS, reducing the wiring resistance on the first power line VSS, which is conducive to accurately transmitting the first voltage on the first power line VSS to the cathodes of the light-emitting elements LE in the pixel circuits in the display region 102.

For example, as shown in FIGS. 4 and 5B, the display substrate further includes a support layer PS. For example, the support layer is located on the side of the second shielding layer 22 away from the first shielding layer 21, and an orthographic projection of the support layer on the base substrate 10 overlaps an orthographic projection of an edge of a column of holes of the plurality of holes away from the display region 102 on the base substrate 10. That is, the support layer PS only covers the leftmost column of holes in the second direction X of the holes HL shown in FIG. 5A to play a supporting role. For example, the support layer PS can be arranged in the same layer as a pixel defining layer PDL described below, and the material of the support layer PS can be the same as the material of the pixel defining layer PDL, which will be described in detail below and will not be repeated here.

For example, as shown in FIG. 5B, the orthographic projection of the pixel defining layer PDL on the base substrate 10 overlaps with the orthographic projection of the edges of the remaining holes except the holes in the leftmost column of holes on the base substrate.

Figure 5E:
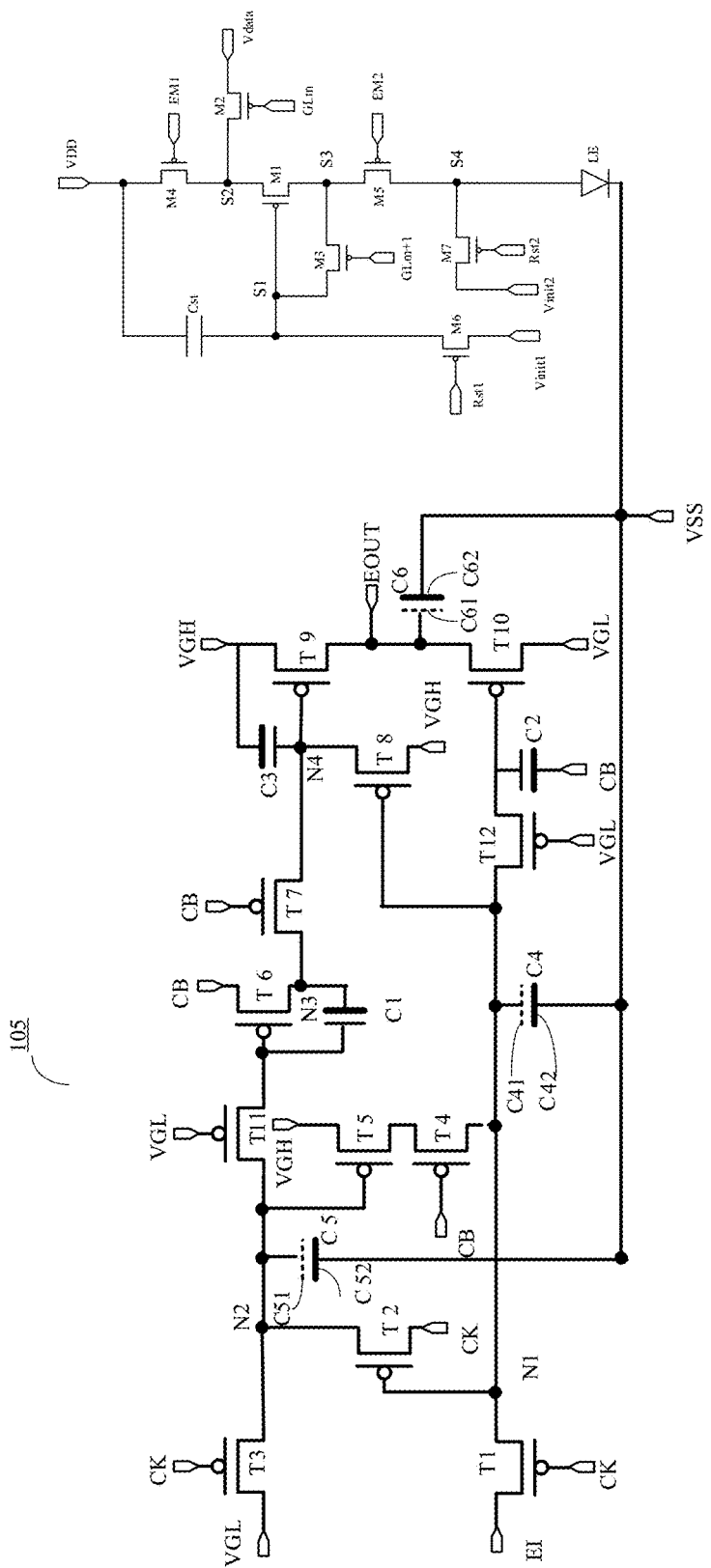
FIG. 5E is a diagram of a connection relationship between a light-emitting control shift register unit and a pixel circuit provided by at least one embodiment of the present disclosure.

FIG. 5A is a schematic diagram of another display substrate provided by at least one embodiment of the present disclosure; FIG. 5B is a cross-sectional view of the display substrate in FIG. 5A along A-A' and B-B' directions; FIG. 5C is a schematic diagram of a light-emitting control shift register unit provided by at least one embodiment of the present disclosure; FIG. 5E is a diagram of a connection relationship between a light-emitting control shift register unit and a pixel circuit provided by at least one embodiment of the present disclosure.

For example, as shown in FIG. 5A, in the second direction X perpendicular to the first direction Y, the hole HL is located between the plurality of first openings 210 and the plurality of second openings 220.

For example, the shape of the hole HL is a regular or irregular shape such as a circle, a square, or a diamond, and the embodiments of the present disclosure are not limited in this aspect. For example, an aperture of the hole HL ranges from 3 μm to 5 μm, and the details may be determined according to actual conditions, and the embodiments of the present disclosure are not limited in this aspect.

For example, as shown in FIG. 1E, the light-emitting control shift register unit 105 further includes a plurality of connection portions, and the plurality of connection portions includes: a first connection portion E1, a second connection portion E2, and a third connection portion E3. For example, the first connection portion E1 includes (or serves as) the first node N1 shown in FIG. 1C, the second connection portion E2 includes (or serves as) the second node N2 shown in FIG. 1C, and the third connection portion E3 includes (or serves as) the output terminal EOUT shown in FIG. 1C.

For example, as shown in FIG. 5C, because a fixed level is applied to the first shielding layer 21 and the second shielding layer 22, respectively (for example, the second level on the first power line VSS as described above), and therefore, the light-emitting control shift register unit 105 further includes a third stabilizing capacitor C4, a fourth stabilizing capacitor C5, and a second stabilizing capacitor C6, so that the ability of the light-emitting control scan driving circuit to maintain to output an effective level can be improved.

For example, as shown in FIG. 5C, a first electrode plate of the third stabilizing capacitor C4 is connected to the first node N1, and a second electrode plate of the third stabilizing capacitor C4 is connected to the first power line VSS; a first electrode plate of the fourth stabilizing capacitor C5 is connected to the second node N2, and a second electrode plate of the fourth stabilizing capacitor C5 is connected to the first power line VSS; a first electrode plate of the second stabilizing capacitor C6 is connected to the second node N2, and a second electrode plate of the second stabilizing capacitor C6 is connected to the first power line VSS.

As shown in FIG. 5E, the first power line VSS in the light-emitting control shift register unit 105 is connected to the cathode of the light-emitting element LE of the pixel circuit in the display region 102. It should be noted that the first power line VSS in the light-emitting control shift register unit 105 and the cathode of the light-emitting element LE of the pixel circuit in the display region 102 are also connected to the second electrode plate C242 of the first stabilizing capacitor C24 in the gate scan shift register unit 104 shown in FIG. 5D.

For example, as shown in FIGS. 5B and 5C, the third stabilizing capacitor C4 is located between the second shielding layer 22 and the first connection portion E1, the fourth stabilizing capacitor C5 is located between the first shielding layer 21 and the second connection portion E2, and the second stabilizing capacitor C6 is located between the first shielding layer 21 and the third connection portion E3.

For example, as shown in FIG. 5B, in the direction perpendicular to the base substrate 10, a semiconductor layer, a first insulation layer 350, a first conductive layer, a second insulation layer 360, a second conductive layer, a third insulation layer 370, a third conductive layer, and a fourth insulation layer 380 are arranged in sequence between the base substrate 10 and the first shielding layer 21.

For example, stabilizing capacitors are formed between the first shielding layer 21 as well as the second shielding layer 22 and the first conductive layer, the second conductive layer, as well as the third conductive layer, respectively. FIG. 5B only shows the capacitors (for example, the second stabilizing capacitor C6, the third stabilizing capacitor, and the fourth stabilizing capacitor) formed between the first shielding layer 21 as well as the second shielding layer 22 and the first connection portion E1, the second connection portion E2, as well as the third connection portion E3 in the third conductive layer, the remaining capacitors are no longer shown, but it should be understood that the remaining capacitors do exist. The first shielding layer 21 and the plurality of second shielding layers 22 together serve as the second electrode plates of the plurality of stabilizing capacitors, the first electrode plates of the plurality of stabilizing capacitors are the first conductive layer, the second conductive layer, or the third conductive layer, the first electrode plate refers to an independent and complete pattern in the peripheral region of the first conductive layer, the second conductive layer, or the third conductive layer, and can be electrically connected to the signal line in the display region through a hole.

For example, the semiconductor layer includes active layers of a plurality of transistors. For example, FIG. 5B shows only an active layer A1 of the first transistor T1, an active layer A2 of the second transistor T2, an active layer A3 of the third transistor T3, an active layer A5 of the fifth transistor T5, and an active layer A9 of the ninth transistor T9.

For example, the first conductive layer includes gate electrodes of the plurality of transistors (for example, FIG. 5B only shows a gate electrode of the first transistor T1, a gate electrode G2 of the second transistor T2, and a gate electrode G5 of the fifth transistor T5) and first electrode plates of a plurality of capacitors, the second conductive layer includes second electrode plates of the plurality of capacitors, and the third conductive layer includes a plurality of connection portions (for example, FIG. 5B only shows the first connection portion E1, the second connection portion E2, and the third connection portion E3), the first clock signal line GCK, the second clock signal line GCB, the second power line VGL, and the third power line VGH.

For example, in some examples, the display substrate 1 further includes a fifth insulation layer and a sixth insulation layer. For example, the fifth insulation layer is located between the first shielding layer 21 and the third conductive layer in the direction perpendicular to the base substrate 10, and the sixth insulation layer is located between the second shielding layer 22 and the third conductive layer in the direction perpendicular to the base substrate 10. For example, the fifth insulation layer includes the first planarization layer PLN1, and the sixth insulation layer includes the first planarization layer PLN1 and the second planarization layer PLN2. Because a distance between the first shielding layer 21 and the third conductive layer (for example, the connection portion of the third conductive layer) is different from a distance between the second shielding layer 22 and the third conductive layer (for example, the connection portion of the third conductive layer), the capacitors formed are also different.

For example, the thicknesses of the first planarization layer PLN1 and the second planarization layer PLN2 ranges from 1.0 μm to 2.0 μm, respectively. For example, the thickness of the first planarization layer PLN1 and the thickness of the second planarization layer PLN2 are the same, for example, both are 1.5 μm, and may also be 1.0 μm or 2.0 μm, etc., and therefore, the thickness of the fifth insulation layer is approximately half the thickness of the sixth insulation layer.

Of course, the thickness of the first planarization layer PLN1 and the thickness of the second planarization layer PLN2 may also be different, and the embodiments of the present disclosure are not limited in this aspect.

For example, a capacitance value of each of the capacitors (for example, the fourth stabilizing capacitor C5 and the second stabilizing capacitor C6) formed between the first shielding layer 21 and the third conductive layer is 10% of a capacitance value of a first capacitor C1, a second capacitor C2, or a third capacitor C3. For example, a capacitance value of a capacitor (for example, the third stabilizing capacitor C4) formed between the second shielding layer 22 and the third conductive layer is one in several dozens of the capacitance value of the first capacitor C1, the second capacitor C2, or the third capacitor C3.

It should be noted that capacitors will also be formed between the first shielding layer 21 as well as the second shielding layer 22 and the first conductive layer as well as the second conductive layer, respectively, that is, each electrode of each transistor and capacitor will form a capacitor (not shown in the figure) with the first power line VSS, so that the ability of the EM GOA to maintain to output an effective level can be improved.

It should be noted that a capacitor will also be formed between each conductive layer of the gate scan driving circuit and the second shielding layer 22, the principle of forming the capacitor is similar to that of EMGOA, and will not be repeated here.

For example, in some embodiments, the gate scan driving circuit further includes a first scan capacitor, and a ratio of a capacitance value of the first stabilizing capacitor C24 to a capacitance value of the first scan capacitor C21 satisfies a following relationship:

$$GH1/EH1 < C24/C21 < GH1/EH2,$$

where GH1 is a duration of an effective level of the gate scan signal output by the gate scan driving circuit in one frame, EH1 is a duration of an effective level of the light-emitting control signal output by the light-emitting control scan driving circuit in one frame, and EH2 is a duration of an ineffective level of the light-emitting control signal output by the light-emitting control scan driving circuit in one frame. Through the ratio of the effective level of the gate scan signal and the effective level or the ineffective level of the light-emitting control signal, the size of the first stabilizing capacitor C24 can be reasonably controlled to meet the different driving capabilities of the gate scan driving circuit and the light-emitting control scan driving circuit, while not causing too much influence on the capacitance of the gate scan driving circuit.

For example, the effective level of the gate scan signal output by the gate scan driving circuit in one frame refers to the level at which the data writing transistor M2 as shown in FIG. 1B is turned on, the effective level of the light-emitting control signal output by the light-emitting control scan driving circuit in one frame refers to the level at which the light-emitting control transistor M4 or M5 as shown in FIG. 1B is turned on, and the ineffective level of the light-emitting control signal output by the light-emitting control scan driving circuit in one frame refers to the level at which the light-emitting control transistor M4 or M5 as shown in FIG. 1B is turned off.

For example, C24/C21≈1/10; GH1/EH1=1/(N−1), N is the number of rows of scan lines, for example, N is 2560 or 1920; GH1/EH2=1/2 or 1/3.

For example, in some embodiments, the ratio of a capacitance value of the second stabilizing capacitor C6 to a capacitance value of the second capacitor C2 of the light-emitting control scan driving circuit satisfies the following relationship:

$$GH1/EH1 < C6/C2 < GH1/EH2,$$

where GH1 is a duration of an effective level of the gate scan signal output by the gate scan driving circuit in one frame, EH1 is a duration of an effective level of the light-emitting control signal output by the light-emitting control scan driving circuit in one frame, and EH2 is a duration of an ineffective level of the light-emitting control signal output by the light-emitting control scan driving circuit in one frame. Through the ratio of the effective level of the gate scan signal and the effective level or the ineffective level of the light-emitting control signal, the size of the second stabilizing capacitor C6 can be reasonably controlled to meet the different driving capabilities of the gate scan driving circuit and the light-emitting control scan driving circuit, while not causing too much influence on the capacitance of the gate scan driving circuit.

For example, C6/C2≈1/5; GH1/EH1=1/(N−1), N is the number of rows of scan lines, for example, N is 2560 or 1920; GH1/EH2=1/2 or 1/3.

For example, in some embodiments, the ratio of the capacitance value of the first stabilizing capacitor C24 to the capacitance value of the first scan capacitor C21 simultaneously satisfies a following relationship:

$$GOL/GOW < C24/C21 < GH1/EH2,$$

where GOL/GOW is a width-to-length ratio of an output transistor of the gate scan driving circuit.

For example, GOL/GOW can also be the width-to-length ratio of the output control transistor of the gate scan driving circuit. By further limiting the relationship between the capacitance value of the first stabilizing capacitor C24 and the capacitance value of the first scan capacitor, the size of the first stabilizing capacitor C24 can be designed more accurately according to the size of the output transistor or the output control transistor, so that the size of the first stabilizing capacitor C24 satisfies the different driving capabilities of the gate scan driving circuit and the light-emitting control scan driving circuit, and at the same time does not cause too much influence on the capacitor of the gate scan driving circuit.

For example, C24/C21 is approximately equal to 1/10; and GOL/GOW=1/50; GH1/EH2=1/2 or 1/3.

For example, in some embodiments, the ratio of the capacitance value of the second stabilizing capacitor C6 to the capacitance value of the second capacitor C2 of the light-emitting control scan driving circuit satisfies the following relationship:

$$EOL/EOW < C6/C2 < GH1/EH2,$$

where EOW/EOL is a width-to-length ratio of an output transistor of the light-emitting control scan driving circuit. By further limiting the relationship between the second stabilizing capacitor C6 and the second capacitor, the size of the second stabilizing capacitor C6 can be designed more accurately according to the size of the output transistor, so that the size of the second stabilizing capacitor C6 meets the different driving capabilities of the gate scan driving circuit and the light-emitting control scan driving circuit, and at the same time does not cause too much influence on the capacitor of the light-emitting control scan driving circuit.

For example, C6/C2 is approximately equal to 1/5, and EOW/EOL=3.5/75=1/21, GH1/EH2=1/2 or 1/3.

For example, in some embodiments, the ratio of the capacitance value of the first stabilizing capacitor C24 to the capacitance value of the first scan capacitor C21 satisfies the following relationship:

$$(GSW/GSL)/(GOW/GOL) < C24/C21 < GH1/EH2,$$

where GOW/GOL is a width-to-length ratio of an output transistor of the gate scan driving circuit, such as the output transistor T25 in FIG. 1F; GSW/GSL is a width-to-length ratio of any switch transistor of the gate scan driving circuit, such as the switch transistors T21, T22, T23, T26, T27, T28 as shown in FIG. 1F. By further limiting the relationship between the capacitance value of the first stabilizing capacitor C24 and the capacitance value of the first scan capacitor, the size of the first stabilizing capacitor C24 can be designed more accurately according to the size of the output transistor or output control transistor and the sizes of other switch transistors, so that the size of the first stabilizing capacitor C24 satisfies the different driving capabilities of the gate scan driving circuit and the light-emitting control scan driving circuit, and at the same time does not cause too much influence on the capacitor of the gate scan driving circuit.

For Gate GOA, the range of the width-to-length ratio of the output transistor is 170~235/3.5~4, and the range of the width-to-length ratio of the switch transistor is 3~40/3.5~8, for example, the width-to-length ratio of the transistor T21 is, for example, 7.6/7 or 7.5/8, the transistor T22 is a double-gate transistor, the width-to-length ratio of the transistor T22 is, for example, 3/3.5, 3.5/3.5, etc., and the width-to-length ratio of the output transistor T25 is, for example, 175/3.5, and the embodiments of the present disclosure are not limited in this aspect. Other transistors can adopt appropriate width-to-length ratios in this field, which will not be repeated here.

For example, (GSW/GSL)/(GOW/GOL)=(7.5/3.5)/(175/3.5)=1/23, here, taking a switch transistor with the largest width-to-length ratio as an example, C24/C21 is approximately equal to 1/10; GH1/EH2=1/2 or 1/3.

For example, in some embodiments, the ratio of the capacitance value of the second stabilizing capacitor C6 to the capacitance value of the second capacitor C2 of the light-emitting control scan driving circuit satisfies the following relationship:

$$(ESW/ESL)/(EOW/EOL) < C6/C2 < GH1/EH2,$$

where EOW/EOL is a width-to-length ratio of an output transistor of the light-emitting control scan driving circuit, such as the output transistor may be the output transistor T9 or T10 in FIG. 1C; ESW/ESL is a width-to-length ratio of any switch transistor of the light-emitting control scan driving circuit, such as the any switch transistor may be any one of the switch transistors T1, T2, T3, T4, T5, T6, T7, T8, T11, T12 in FIG. 1C. By further limiting the relationship between the capacitance value of the second stabilizing capacitor C6 and the capacitance value of the second capacitor, the size of the second stabilizing capacitor C6 can be designed more accurately according to the size of the output transistor and the sizes of other switch transistors, so that the size of the second stabilizing capacitor C6 satisfies the different driving capabilities of the gate scan driving circuit and the light-emitting control scan driving circuit, and at the same time does not cause too much influence on the capacitor of the light-emitting control scan driving circuit.

For example, (ESW/ESL)/(EOW/EOL)=(7.5/3.2)/(75/3.5)=1/9. Here, taking the switch transistor with the largest width-to-length ratio as an example, C6/C2 is approximately equal to 1/5, GH1/EH2=1/2 or 1/3. For EMGOA, the range of the width-to-length ratio of the output transistor is 75~80/3.5~4, the range of the width-to-length ratio of the switch transistor is 3.2~8/3.2~11; for example, the width-to-length ratio of the transistor T1 is 7.5~7.8/4.6~5.5, such as 7.5/4.6 or 7.5/5.5, etc.; the transistor T2 is a double-gate transistor, and the width-to-length ratio of the transistor T2 is 3.6~4/8.2~11, such as 3.7/8.2 or 3.7/10, etc.; the width-to-length ratio of the transistor T5 is 7~8/4.7~5, such as 7.5/4.7, and the width-to-length ratio of the output transistor T9 is, for example, 75/3.5, the details may be determined according to actual conditions, and the embodiments of the present disclosure are not limited in this aspect. Other transistors can adopt appropriate width-to-length ratios in this field, which will not be repeated here.

For example, GOW/GOL may also be the width-to-length ratio of the output control transistor T24 of the gate scan driving circuit.

The second capacitor C2 in the above formula can also be replaced by the first capacitor C1 or the third capacitor C3, the first scan capacitor C21 can also be replaced by the second scan capacitor C22, and the embodiments of the present disclosure are not limited thereto.

In the embodiment of the present disclosure, by controlling the size of the first stabilizing capacitor C24 and the size of the second stabilizing capacitor C6, the first stabilizing capacitor C24 and the second stabilizing capacitor C6 ensure the driving capabilities of the gate scan driving circuit and the light-emitting control scan driving circuit, and at the same time, too much influence of the coupling capacitor on the original storage capacitor can be avoided.

It should be noted that because the first shielding layer 21 does not cover the shift register unit in the gate scan driving circuit, almost no capacitor is formed between the first shielding layer 21 and the gate scan driving circuit. Of course, the specific situation may be determined according to actual conditions, and the embodiments of the present disclosure are not limited in this aspect.

For example, a pixel defining layer PDL is further included on the side of the second shielding layer 22 away from the first shielding layer 21 for defining pixels of the display region 102.

For example, in some examples, as shown in FIG. 4, the first planarization layer PLN1 and the second planarization layer PLN2 further include an open slot 30 provided between the light-emitting control scan driving circuit 5 and the gate scan driving circuit 4.

For example, the first planarization layer PLN1 comprises a first part located on a side of the open slot 30 away from the display region 102 and covering the light-emitting control scan driving circuit 5, and a second part located on the side of the open slot 30 away from the display region 102 and covering the gate scan driving circuit 4; for example, the second planarization layer PLN2 comprises a first part located on the side of the open slot 30 away from the display region 102 and covering the light-emitting control scan driving circuit 5, and a second part located on the side of the open slot 30 away from the display region 102 and covering the gate scan driving circuit 4.

For example, an orthographic projection of an edge of the first shielding layer 21 close to the display region 102 on the base substrate 10 falls within an orthographic projection of the first part of the second planarization layer PLN2 on the base substrate 10; the orthographic projection of the first part of the second planarization layer PLN2 on the base substrate falls within an orthographic projection of the first part of the first planarization layer PLN1 on the base substrate; thereby ensuring that the second planarization layer PLN2 can cover the first shielding layer 21, and the edge of the second planarization layer PLN2 and the edge of the first planarization layer PLN1 maintain a certain distance, a slope angle of the second planarization layer PLN2 and a slope angle of the first planarization layer PLN1 at the open slot 30 are not too large, so as to ensure that the second shielding layer 22 is not easily damaged at the open slot 30.

For example, the second shielding layer 22 extends from the region corresponding to the light-emitting control scan driving circuit 5 to the region corresponding to the gate scan driving circuit 4 and covers the open slot 30.

For example, the width B of the orthographic projection of the second shielding layer 22 covering the open slot 30 on the base substrate 10 along the second direction X is expressed as the following formula:

$$B = A + k1*P1 + k2*Q1 + k3*P2 + k4*Q2,$$

$$P1 = d1*\tan(c1), P2 = d2*\tan(c2),$$

where A represents the width of the orthographic projection of the open slot 30 on the base substrate 10 in the second direction X, P1 represents the width of the orthographic projection of a first slope 231 of the second shielding layer 22 on the base substrate 10, Q1 represents the width of the orthographic projection of a first platform 230 of the second shielding layer 22 on the base substrate 10, P2 represents the width of the orthographic projection of a second slope 229 of the second shielding layer 22 on the base substrate 10, Q2 represents the width of the orthographic projection of a second platform 228 of the second shielding layer 22 on the base substrate 10, d1 represents the thickness of the first planarization layer PLN1, and d2 represents the thickness of the second planarization layer PLN2, c1 represents the slope angle of the first planarization layer PLN1, c2 represents the slope angle of the second planarization layer PLN2, k1, k2, k3, and k4 are coefficients, among them, 1<k1≤2, 1<k2≤2, 1<k3≤2, 1<k4≤2. That is, by adjusting the thickness or slope angle of the first planarization layer PLN1, or by adjusting the thickness or slope angle of the second planarization layer PLN2, the width of the orthographic projection of the second shielding layer 22 covering the open slot 30 on the base substrate 10 along the second direction X can be adjusted to ensure that the second shielding layer 22 covering the open slot 30 has good continuity and is not prone to defective disconnection. Of course, k1, k2, k3, and k4 may not be equal, and the specific values of k1, k2, k3, and k4 may be determined according to actual conditions, and are not limited in the embodiments of the present disclosure.

For example, A ranges from 11 μm to 12 μm, such as A=11.3 μm, 11.5 μm, etc.; d1 ranges from 1.5 μm to 1.8 μm, d2 ranges from 1.5 μm to 1.8 μm, for example, d1 and d2 are both 1.5 μm; the angle range of c1 ranges from 20° to 30°, and the angle range of c2 ranges from 20° to 30°, such as, c1 is 25° and c2 is 28°; Q1 ranges from 3 μm to 5 μm, for example Q1=4 μm; Q2 ranges from 1 μm to 4 μm, for example Q2=2 μm.

For example, according to the above parameter ranges, B ranges from 30 μm to 50 μm, such as B=35.8 μm.

For example, at a position where the first shielding layer 21 is close to the open slot 30, the included angle between the first shielding layer 21 and the second shielding layer 22 ranges from 25° to 40°. For example, the included angle between the first shielding layer 21 and the second shielding layer 22 is 25°, 40°, 30°, etc., and the embodiments of the present disclosure are not limited in this aspect.

Figure 6:
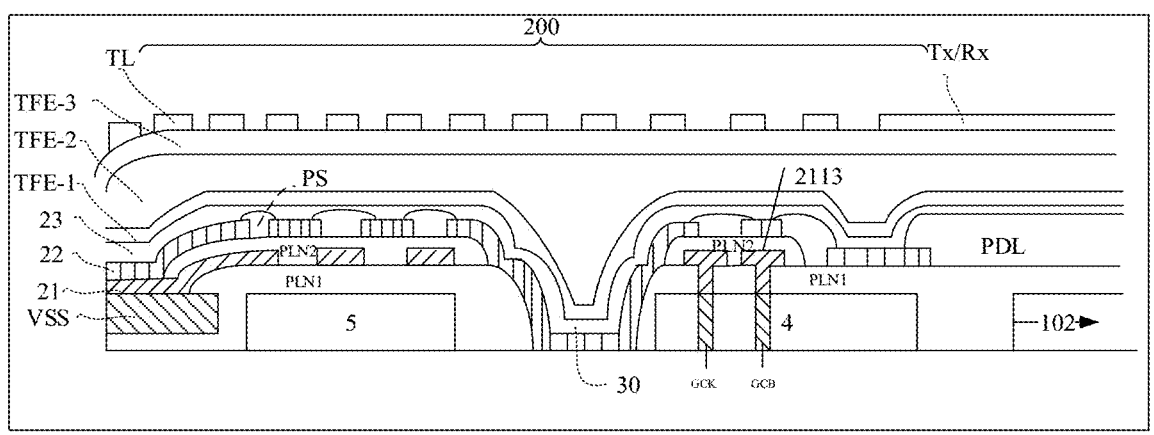
FIG. 6 is a cross-sectional view of another display substrate provided by at least one embodiment of the present disclosure.

FIG. 6 is a cross-sectional view of another display substrate provided by at least one embodiment of the present disclosure. As shown in FIG. 6, the display substrate 1 further includes: a pixel defining layer PDL, a cathode layer 23, a first encapsulation layer TFE-1, a second encapsulation layer TFE-2, and a third encapsulation layer TFE-3.

For example, the pixel defining layer PDL is located in the display region 102, includes a plurality of openings to define a plurality of pixel units, and is located on the side of the second shielding layer 22 away from the base substrate 10. An orthographic projection of an edge of the pixel defining layer PDL close to the peripheral region on the base substrate overlaps the edge of the gate scan driving circuit 4 close to the display region 102. For example, the pixel defining layer PDL may extend from the display region 102 to the output transistor of the gate scan driving circuit. For example, the output transistor of the gate scan driving circuit is configured to output a gate scan signal.

The cathode layer 23 is located on a side of the pixel defining layer PDL away from the base substrate 10, for example, the part of the cathode layer 23 away from the display region 102 is in contact with the first part 2211 of the second shielding layer 22, a part, except the part of the cathode layer 23 that is in contact with the first part 2211 of the second shielding layer 22, of the cathode layer 23 away from the display region 102 is in contact with a part, except the part of the second opening, of the second part 2212 of the second shielding layer 22, so that the first voltage on the first power line VSS can be transmitted to the cathode layer 23, so that the light-emitting elements LE in the display region 102 can be driven to emit light.

For example, the anode layer of the light-emitting element LE and the second shielding layer 22 are arranged in the same layer, the anode layer of the light-emitting element LE does not overlap the first shielding layer 21 and the second shielding layer 22.

For example, the first encapsulation layer TFE-1 is located on the side of the cathode layer 23 away from the base substrate 10; the second encapsulation layer TFE-2 is located on the side of the first encapsulation layer TFE-1 away from the base substrate 10; and the third encapsulation layer TFE-3 is located on the side of the second encapsulation layer TFE-2 away from the base substrate 10.

For example, the size of the gate scan driving circuit 4 in the second direction X is about 250 μm, and the size of the light-emitting control scan driving circuit 5 in the second direction X is about 100 μm, the third encapsulation layer TFE-3 completely covers the first shielding layer 21, and a distance between the edge of the first shielding layer 21 away from the display region 102 and the edge of the third encapsulation layer TFE-3 away from the display region 102 ranges from 95 μm to 105 μm, such as about 95 μm, 100 μm, or 105 μm, etc., and the embodiments of the present disclosure are not limited in this aspect.

For example, the display substrate 1 further includes a touch structure 200, for example, the touch structure 200 is a flexible multi-layer on-cell (FMLOC) structure, and is located on the side of the third encapsulation layer TFE-3 away from the base substrate 10, to achieve the touch function of the display panel.

For example, FMLOC includes a plurality of touch traces TL respectively connected to touch driving electrodes Tx and touch sensing electrodes Rx. For example, the touch driving electrodes Tx and the touch sensing electrodes Rx are located in the display region 102 to achieve the touch function of the display panel. The specific structure and specific working principle can refer to the design in this field, and will not be repeated here.

For example, as shown in FIG. 6, the orthographic projection of the first shielding layer 21 and the orthographic projection of the second shielding layer 22 on the base substrate 10 at least partially overlap the orthographic projection of the touch traces TL on the base substrate 10.

For example, as shown in FIG. 6, the orthographic projection of at least part of the touch traces TL on the base substrate 10 falls into the open slot 30 of the first planarization layer PLN1 and the second planarization layer PLN2.

For example, in some examples, as shown in FIGS. 4 and 6, the first shielding layer 21 further includes a third part 2213, an orthographic projection of the third part 2113 on the base substrate 10 overlaps and is in contact with the orthographic projection of the signal lines (for example, the third signal line GCK and the fourth signal line GCB) of the gate scan driving circuit 4 on the base substrate 10, and therefore, the thickness of the signal line can be increased to reduce the trace resistance of the signal line. For example, the signal line of the gate scan driving circuit 4 is configured to provide a clock signal to the gate scan driving circuit 4. For example, the third signal line GCK and the fourth signal line GCB are configured to provide the third clock signal and the fourth clock signal to the gate scan driving circuit 4, to control the shift output of the gate scan driving circuit 4, the specific working process can refer to the introduction in the art, and will not be repeated here.

It should be noted that, for example, the material of the semiconductor layer may include oxide semiconductor, organic semiconductor, or amorphous silicon, polysilicon, etc., for example, the oxide semiconductor includes a metal oxide semiconductor (for example, indium gallium zinc oxide (IGZO)), and the polysilicon includes low-temperature polysilicon or high-temperature polysilicon, and the embodiments of the present disclosure are not limited thereto. It should be noted that the above-mentioned source region and drain region may be regions doped with n-type impurities or p-type impurities, the embodiments of the present disclosure are not limited in this aspect.

For example, the material of the third conductive layer may include titanium, titanium alloy, aluminum, aluminum alloy, copper, copper alloy, or any other suitable composite material, and the embodiments of the present disclosure are not limited in this aspect. For example, the materials of the first conductive layer and the second conductive layer may be the same as the material of the third conductive layer, and similar portions will not be repeated here.

For example, the materials of the first insulation layer 350, the second insulation layer 360, the third insulation layer 370, and the fourth insulation layer 380 may include inorganic insulation materials such as SiNx, SiOx, SiNxOy, etc., organic insulation materials such as organic resins, or other suitable materials, and the embodiments of the present disclosure are not limited in this aspect.

For example, the anode layer of the light-emitting element LE may be made of a material including transparent metal oxides such as indium tin oxide (ITO) or indium zinc oxide (IZO), etc., which has a relatively high light transmittance. The material of the anode layer of the light-emitting element LE is made of metal, for example, the metal can be, such as, magnesium, magnesium alloy, aluminum, or aluminum alloy, etc.

For example, the material of the first shielding layer 21 and the material of the second shielding layer 22 are made of metal, for example, the metal can be such as magnesium, magnesium alloy, aluminum, or aluminum alloy, etc., so as to achieve shielding of the transistor, and the embodiments of the present disclosure are not limited in this aspect.

For example, the materials of the first planarization layer PLN1 and the second planarization layer PLN2 include organic materials, such as polymer resin materials, such as polyimide (PI), polymethyl methacrylate or polystyrene (PS), and aromatic, propylene based polymer, phthalimide-based polymers, aryl ether-based polymers, amino polymers, fluorine-based polymers, and p-xylene-based polymers, vinyl alcohol-based polymers, etc.

For example, the materials of the first encapsulation layer TFE-1 to the third encapsulation layer TFE-3 may include inorganic materials or organic materials. For example, the inorganic materials may include inorganic materials such as silicon nitride, silicon oxide, and silicon oxynitride, etc., the compactness of the inorganic materials is highly, which can prevent the intrusion of water, oxygen, etc., for example, the organic materials can be organic materials such as polymer materials containing desiccants or polymer materials that can block water vapor. These organic materials can flatten the surface of the display substrate, and can relieve the stress of the first inorganic encapsulation layer and the stress of the second inorganic encapsulation layer, and the organic materials can also comprise water-absorbing materials, such as desiccants, to absorb substances such as water and oxygen that have penetrated into the interior.

At least one embodiment of the present disclosure also provides a light-emitting control scan driving circuit. FIG. 7 is a schematic diagram of a light-emitting control scan driving circuit provided by at least one embodiment of the present disclosure. As shown in FIG. 7, a plurality of cascaded light-emitting control shift register units 105 are included. For example, the circuit structure of the light-emitting control shift register unit 105 may be implemented as the circuit structure shown in FIG. 5C.

For example, for each light-emitting control shift register unit 105, the light-emitting control shift register unit 105 includes a plurality of transistors, a plurality of capacitors, a plurality of connection portions, a first shielding layer 21, and a second shielding layer 22.

For example, the first shielding layer 21 is located between the plurality of connection portions and the second shielding layer 22.

For example, the plurality of transistors include: a first transistor T1, a second transistor T2, a third transistor T3, a fourth transistor T4, a fifth transistor T5, a sixth transistor T6, a seventh transistor T7, an eighth transistor T8, and a ninth transistor T9 (also called an output transistor), a tenth transistor T10, an eleventh transistor T11, and a twelfth transistor T12. The plurality of capacitors includes a first capacitor C1, a second capacitor C2, a third capacitor C3, a third stabilizing capacitor C4, a fourth stabilizing capacitor C5, and a second stabilizing capacitor C6.

For example, as shown in FIG. 5C, a gate electrode of the first transistor T1 is connected to a first clock signal terminal CK (the first clock signal terminal CK is connected to a first clock signal line ECK) to receive a first clock signal, a second electrode of the first transistor T1 is connected to an input terminal EI, and a first electrode of the first transistor T1 is connected to a first node N1.

A gate electrode of the second transistor T2 is connected to the first node N1, a first electrode of the second transistor T2 is connected to the second node N2, and a second electrode of the second transistor T2 is connected to the first clock signal terminal CK to receive the first clock signal.

A gate electrode of the third transistor T3 is connected to the first clock signal terminal CK to receive the first clock signal, a first electrode of the third transistor T3 is connected to the second node N2, and a second electrode of the third transistor T3 is connected to a second power line VGL to receive a second voltage.

A gate electrode of the fourth transistor T4 is connected to a second clock signal terminal CB (for example, the second clock signal terminal CB is connected to a second clock signal line ECB) to receive a second clock signal, a first electrode of the fourth transistor T4 is connected to the first node N1, and a second electrode of the fourth transistor T4 is connected to a second electrode of the fifth transistor T5.

A gate electrode of the fifth transistor T5 is connected to the second node N2, and a first electrode of the fifth transistor T5 is connected to a third power line VGH to receive a third voltage.

A gate electrode of the sixth transistor T6 is connected to a second electrode of the eleventh transistor T11, a first electrode of the sixth transistor T6 is connected to the second clock signal terminal CB to receive the second clock signal, and a second electrode of the sixth transistor T6 is connected to a third node N3.

A first electrode of the first capacitor C1 is connected to a second electrode of the eleventh transistor T11, and a second electrode of the first capacitor C2 is connected to the third node N3.

A gate electrode of the seventh transistor T7 is connected to the second clock signal terminal CB to receive the second clock signal, a first electrode of the seventh transistor T7 is connected to the third node N3, and a second electrode of the seventh transistor T7 is connected to a fourth node N4.

A gate electrode of the eighth transistor T8 is connected to the first node N1, a first electrode of the eighth transistor T8 is connected to the fourth node N4, and a second electrode of the eighth transistor T8 is connected to the third power line VGH to receive the third voltage.

A gate electrode of the ninth transistor T9 is connected to the fourth node N4, a first electrode of the ninth transistor T9 is connected to the third power line VGH to receive the third voltage, and a second electrode of the ninth transistor T9 is connected to the output terminal EOUT.

A first electrode of the third capacitor C3 is connected to the fourth node N4, and a second electrode of the third capacitor C3 is connected to the third power line VGH to receive the third voltage.

A gate electrode of the tenth transistor T10 is connected to a second electrode of the twelfth transistor T12, a first electrode of the tenth transistor T10 is connected to the second power line VGL to receive the second voltage, and a second electrode of the tenth transistor T10 is connected to the output terminal EOUT.

A first electrode of the second capacitor C2 is connected to a second electrode of the twelfth transistor T12, and a second electrode of the second capacitor C2 is connected to the second clock signal terminal CB to receive the second clock signal.

A gate electrode of the eleventh transistor T11 is connected to the second power line VGL to receive the second voltage, and a first electrode of the eleventh transistor T11 is connected to the second node N2.

A gate electrode of the twelfth transistor T12 is connected to the second power line VGL to receive the second voltage, and a first electrode of the twelfth transistor T12 is connected to the first node N1.

For example, as shown in FIG. 5C, a first electrode plate of the third stabilizing capacitor C4 is connected to the first node N1, and a second electrode plate of the third stabilizing capacitor C4 is connected to the first power line VSS; a first electrode plate of the fourth stabilizing capacitor C5 is connected to the second node N2, and a second electrode plate of the fourth stabilizing capacitor C5 is connected to the first power line VSS; a first electrode plate of the second stabilizing capacitor C6 is connected to the second node N2, and a second electrode plate of the second stabilizing capacitor C6 is connected to the first power line VSS.

For example, the plurality of connection portions includes: a first connection portion E1, a second connection portion E2, and a third connection portion E3. For example, the first connection portion E1 includes (or serves as) the first node N1 shown in FIG. 1C, the second connection portion E2 includes (or serves as) the second node N2 shown in FIG. 1C, and the third connection portion E3 includes (or serves as) the output terminal EOUT shown in FIG. 1C.

For example, in the embodiments of the present disclosure, the first shielding layer 21 covers at least one transistor in the light-emitting control shift register unit 105, and the second shielding layer 22 covers at least one transistor of the plurality of transistors in the light-emitting control shift register unit 105 except the at least one transistor covered by the first shielding layer 21.

It should be noted that, for the specific introduction of the above-mentioned light-emitting control scan driving circuit, reference may be made to the description in FIGS. 1A to 6, and the repeated portions are not repeated here.

Regarding the technical effects of the light-emitting control scan driving circuit provided in the foregoing embodiments, reference may be made to the technical effects of the display substrate 1 provided in the embodiments of the present disclosure, and similar portions will not be repeated here.

At least one embodiment of the present disclosure also provides a display device. FIG. 8 is a schematic diagram of a display device provided by at least one embodiment of the present disclosure. As shown in FIG. 8, the display device 2 includes a display substrate 1 provided by any one embodiment of the present disclosure, for example, the display substrate 1 shown in FIG. 2A.

It should be noted that the display device 2 can be any product or component with a display function, such as an OLED panel, an OLED TV, a QLED panel, a QLED TV, a mobile phone, a tablet computer, a notebook computer, a digital photo frame, a navigator, and the like. The display device 2 may also include other components, such as a data driving circuit, a timing controller, etc., and the embodiments of the present disclosure are not limited in this aspect.

It should be noted that, for the sake of clarity and conciseness, the embodiments of the present disclosure do not provide all the constituent units of the display device. In order to implement the basic functions of the display device, those skilled in the art can provide and set other structures not shown according to specific needs, and the embodiments of the present disclosure are not limited in this aspect.

Regarding the technical effects of the display device 2 provided by the above-mentioned embodiments, reference may be made to the technical effects of the display substrate 1 provided in the embodiments of the present disclosure, and repeated portions will not be repeated here.

At least one embodiment of the present disclosure also provides a manufacturing method of a display substrate. FIG. 9 is a flowchart of a manufacturing method of a display substrate provided by at least one embodiment of the present disclosure. For example, the manufacturing method can be used to manufacture the display substrate provided by any one embodiment of the present disclosure. For example, the manufacturing method can be used to manufacture the display substrate 1 shown in FIG. 2A.

As shown in FIG. 9, the manufacturing method of the display substrate includes step S110 to step S120.

Step S110: providing a base substrate.

Step S120: forming a gate scan driving circuit, a light-emitting control scan driving circuit, a first shielding layer, and a second shielding layer on the base substrate.

For example, the first shielding layer 21 covers at least one transistor in the light-emitting control scan driving circuit 105, and the second shield layer 22 covers at least one transistor of the plurality of transistors in the light-emitting control scan driving circuit 105 except the at least one transistor covered by the first shielding layer 21.

It should be noted that in the plurality of embodiments of the present disclosure, the flow of the manufacturing method for manufacturing the display substrate may include more or fewer operations, and these operations may be performed sequentially or in parallel. Although the flow of the manufacturing method described above includes a plurality of operations appearing in a specific order, it should be clearly understood that the order of the plurality of operations is not limited. The above-described manufacturing method can be executed once, or executed several times according to predetermined conditions.

Regarding the technical effects of the manufacturing method of the display substrate provided in the above-mentioned embodiments, reference may be made to the technical effects of the display substrate provided in the embodiments of the present disclosure, and similar portions will not be repeated here.

The following should be noted:
  (1) Only the structures involved in the embodiments of the present disclosure are illustrated in the drawings of the embodiments of the present disclosure, and other structures can refer to usual designs;
  (2) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:
   a base substrate, comprising a display region and a peripheral region on at least one side of the display region;
   a gate scan driving circuit, a light-emitting control scan driving circuit, and a first power line in the peripheral region of the base substrate and arranged in sequence along a side of the peripheral region away from the display region, wherein an output terminal of the gate scan driving circuit is electrically connected to at least one data writing transistor in the display region, the gate scan driving circuit is configured to output a gate scan signal, the data writing transistor is configured to control the writing of a data signal in response to the gate scan signal, an output terminal of the light-emitting control scan driving circuit is electrically connected to at least one light-emitting control transistor in the display region, the light-emitting control scan driving circuit is configured to output a light-emitting control signal, the light-emitting control transistor is configured to control a light-emitting element to emit light in response to the light-emitting control signal, and the first power line is electrically connected to a cathode of at least one light-emitting element in the display region;
   a first planarization layer and a second planarization layer, wherein the first planarization layer and the second planarization layer further comprise an open slot provided between the light-emitting control scan driving circuit and the gate scan driving circuit;
   a first shielding layer and a second shielding layer which are sequentially arranged on a side of the light-emitting control scan driving circuit away from the base substrate; and
   a touch structure, comprising a plurality of touch traces respectively connected to touch driving electrodes and touch sensing electrodes;
   wherein the second shielding layer extends from a region corresponding to the light-emitting control scan driving circuit to a region corresponding to the gate scan driving circuit and covers the open slot; and
   an orthographic projection of at least part of the touch traces on the base substrate falls into the open slot, and in an area of the open slot, an orthographic projection of the second shielding layer on the base substrate overlaps with an orthographic projection of a part of the touch traces on the base substrate.

2. The display substrate according to claim 1, wherein in an area where the second shielding layer is close to the open slot, an orthographic projection of the second shielding layer covering the open slot on the base substrate overlaps with an orthographic projection of the first shielding layer on the base substrate.

3. The display substrate according to claim 2, wherein at each of two sides where the second shielding layer is close to the open slot, an orthographic projection of the second shielding layer covering the open slot on the base substrate overlaps with an orthographic projection of the first shielding layer on the base substrate.

4. The display substrate according to claim 3, wherein the gate scan driving circuit comprises a first stabilizing capacitor, a first electrode plate of the first stabilizing capacitor is electrically connected to the output terminal of the gate scan driving circuit, and a second electrode plate of the first stabilizing capacitor is electrically connected to the first power line.

5. The display substrate according to claim 3, wherein the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically connected to the first power line, the second electrode plate of the second stabilizing capacitor comprises a first part and a second part, and an organic insulation layer is provided between the first part and the second part of the second electrode plate of the second stabilizing capacitor in a direction perpendicular to the base substrate.

6. The display substrate according to claim 2, wherein the gate scan driving circuit comprises a first stabilizing capacitor, a first electrode plate of the first stabilizing capacitor is electrically connected to the output terminal of the gate scan driving circuit, and a second electrode plate of the first stabilizing capacitor is electrically connected to the first power line.

7. The display substrate according to claim 2, wherein the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically the first part and the second part of the second electrode plate of the second stabilizing capacitor in a direction perpendicular to the base substrate.

8. The display substrate according to claim 1, wherein in an area where the second shielding layer is close to the open slot, an orthographic projection of the second shielding layer covering the open slot on the base substrate overlaps with an orthographic projection of the first shielding layer on the base substrate and an orthographic projection of the touch traces on the base substrate respectively.

9. The display substrate according to claim 8, wherein the gate scan driving circuit comprises a first stabilizing capacitor, a first electrode plate of the first stabilizing capacitor is electrically connected to the output terminal of the gate scan driving circuit, and a second electrode plate of the first stabilizing capacitor is electrically connected to the first power line.

10. The display substrate according to claim 8, wherein the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically the first part and the second part of the second electrode plate of the second stabilizing capacitor in a direction perpendicular to the base substrate.

11. The display substrate according to claim 1, wherein at each of two sides where the second shielding layer is close to the open slot, an orthographic projection of the second shielding layer covering the open slot on the base substrate overlaps with an orthographic projection of the first shielding layer on the base substrate and an orthographic projection of the touch traces on the base substrate respectively.

12. The display substrate according to claim 11, wherein the gate scan driving circuit comprises a first stabilizing capacitor, a first electrode plate of the first stabilizing capacitor is electrically connected to the output terminal of the gate scan driving circuit, and a second electrode plate of the first stabilizing capacitor is electrically connected to the first power line.

13. The display substrate according to claim 11, wherein the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically connected to the first power line, the second electrode plate of the second stabilizing capacitor comprises a first part and a second part, and an organic insulation layer is provided between the first part and the second part of the second electrode plate of the second stabilizing capacitor in a direction perpendicular to the base substrate.

14. The display substrate according to claim 1, wherein an orthographic projection of the first shielding layer on the base substrate and an orthographic projection of the second shielding layer on the base substrate at least partially overlap with an orthographic projection of the touch traces on the base substrate.

15. The display substrate according to claim 14, wherein the gate scan driving circuit comprises a first stabilizing capacitor, a first electrode plate of the first stabilizing capacitor is electrically connected to the output terminal of the gate scan driving circuit, and a second electrode plate of the first stabilizing capacitor is electrically connected to the first power line.

16. The display substrate according to claim 14, wherein the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically the first part and the second part of the second electrode plate of the second stabilizing capacitor in a direction perpendicular to the base substrate.

17. The display substrate according to claim 1, wherein the gate scan driving circuit comprises a first stabilizing capacitor, a first electrode plate of the first stabilizing capacitor is electrically connected to the output terminal of the gate scan driving circuit, and a second electrode plate of the first stabilizing capacitor is electrically connected to the first power line.

18. The display substrate according to claim 1, wherein the light-emitting control scan driving circuit comprises a second stabilizing capacitor, a first electrode plate of the second stabilizing capacitor is electrically connected to the output terminal of the light-emitting control scan driving circuit, a second electrode plate of the second stabilizing capacitor is electrically connected to the first power line, the second electrode plate of the second stabilizing capacitor comprises a first part and a second part, and an organic insulation layer is provided between the first part and the second part of the second electrode plate of the second stabilizing capacitor in a direction perpendicular to the base substrate.

* * * * *